United States Patent
Sano et al.

(10) Patent No.: US 9,887,219 B2
(45) Date of Patent: Feb. 6, 2018

(54) SOLID-STATE IMAGING DEVICE, MANUFACTURING METHOD OF SOLID-STATE IMAGING DEVICE, AND ELECTRONIC DEVICE

(71) Applicant: SONY SEMICONDUCTOR SOLUTIONS CORPORATION, Kanagawa (JP)

(72) Inventors: Takuya Sano, Tokyo (JP); Ryusei Naito, Kanagawa (JP); Kazunobu Ota, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/309,300

(22) PCT Filed: May 1, 2015

(86) PCT No.: PCT/JP2015/063057
§ 371 (c)(1),
(2) Date: Nov. 7, 2016

(87) PCT Pub. No.: WO2015/174296
PCT Pub. Date: Nov. 19, 2015

(65) Prior Publication Data
US 2017/0077155 A1    Mar. 16, 2017

(30) Foreign Application Priority Data

May 16, 2014  (JP) .................................. 2014-102181
Mar. 11, 2015  (JP) .................................. 2015-048488

(51) Int. Cl.
*H01L 27/146*  (2006.01)
*H04N 5/374*  (2011.01)
*H04N 5/225*  (2006.01)

(52) U.S. Cl.
CPC .... *H01L 27/14612* (2013.01); *H01L 27/1463* (2013.01); *H01L 27/1464* (2013.01);
(Continued)

(58) Field of Classification Search
CPC ......... H01L 27/14612; H01L 27/14614; H01L 27/14621; H01L 27/14623;
(Continued)

(56) References Cited

U.S. PATENT DOCUMENTS

| 8,088,639 B2 * | 1/2012 | Ezaki | ................ H01L 27/14603 257/233 |
| 2005/0167704 A1 * | 8/2005 | Ezaki | ................ H01L 27/14603 257/233 |

(Continued)

FOREIGN PATENT DOCUMENTS

| JP | 8-316450 A | 11/1996 |
| JP | 2002-314061 A | 10/2002 |

(Continued)

OTHER PUBLICATIONS

International Search Report prepared by the Japan Patent Office dated Jul. 8, 2015, for International Application No. PCT/JP2015/063057.

*Primary Examiner* — Karen Kusumakar
(74) *Attorney, Agent, or Firm* — Sheridan Ross P.C.

(57) ABSTRACT

The present technology relates to a solid-state imaging device, a manufacturing method of a solid-state imaging device, and an electronic device, in which degradation of transfer characteristics of a photo diode can be suppressed. A floating diffusion is formed to reach the same depth as a layer of a photo diode formed on a silicon substrate, and a transfer transistor gate is formed therebetween. A channel that is opened/closed by control of the transfer transistor gate is formed in the silicon substrate formed with the photo (Continued)

diode. With this configuration, charge accumulated in the photo diode can be transferred to the floating diffusion in a vertical direction relative to the depth direction, and degradation of transfer characteristics caused by elimination of the transfer channel can be suppressed by setting the transfer channel in the depth direction. The present technology can be applied to a solid-state imaging device.

17 Claims, 20 Drawing Sheets

(52) U.S. Cl.
CPC .. *H01L 27/14614* (2013.01); *H01L 27/14621* (2013.01); *H01L 27/14623* (2013.01); *H01L 27/14627* (2013.01); *H01L 27/14636* (2013.01); *H01L 27/14638* (2013.01); *H01L 27/14641* (2013.01); *H01L 27/14645* (2013.01); *H01L 27/14689* (2013.01); *H04N 5/2253* (2013.01); *H04N 5/374* (2013.01)

(58) Field of Classification Search
CPC ........... H01L 27/14627; H01L 27/1463; H01L 27/14636; H01L 27/14638; H01L 27/1464; H01L 27/14641; H01L 27/14645; H01L 27/14689; H04N 5/2253
See application file for complete search history.

(56) References Cited

U.S. PATENT DOCUMENTS

| | | | | |
|---|---|---|---|---|
| 2009/0200624 A1* | 8/2009 | Dai | ................... | H01L 27/14603 257/432 |
| 2009/0242949 A1* | 10/2009 | Adkisson | .......... | H01L 27/14603 257/292 |
| 2011/0019063 A1* | 1/2011 | Watanabe | ......... | H01L 27/14603 348/340 |
| 2011/0187911 A1* | 8/2011 | Shinohara | ......... | H01L 27/14812 348/308 |
| 2012/0267690 A1* | 10/2012 | Endo | ................ | H01L 27/14632 257/225 |

FOREIGN PATENT DOCUMENTS

| | | |
|---|---|---|
| JP | 2005-223084 A | 8/2005 |
| JP | 2010-114323 A | 5/2010 |
| JP | 2011-29453 A | 2/2011 |
| JP | 2011-138841 A | 7/2011 |
| JP | 2014-199898 A | 10/2014 |

* cited by examiner

SOLID-STATE IMAGING DEVICE, MANUFACTURING METHOD OF SOLID-STATE IMAGING DEVICE, AND ELECTRONIC DEVICE

CROSS REFERENCE TO RELATED APPLICATIONS

This application is a national stage application under 35 U.S.C. 371 and claims the benefit of PCT Application No. PCT/JP2015/063057 having an international filing date of 1 May 2015, which designated the United States, which PCT application claimed the benefit of Japanese Patent Application No. 2014-102181 filed 16 May 2014, and Japanese Patent Application No. 2015-048488 filed 11 Mar. 2015, the disclosures of which are incorporated herein by reference in their entirety.

TECHNICAL FIELD

The present technology relates to a solid-state imaging device, a manufacturing method of the solid-state imaging device, and an electronic device, and particularly relates to the solid-state imaging device, the manufacturing method of the solid-state imaging device, and the electronic device in which degradation of charge transfer characteristics from a photo diode is suppressed.

BACKGROUND ART

In the related art, due to advancement of miniaturization of a pixel size, a technology of pixel sharing (pixel sharing technology) is more often adopted in a complementary metal oxide semiconductor (CMOS) image sensor in order to maximize an aperture ratio of a photo diode (PD). The pixel sharing technology is a technology to secure an aperture area of a photo diode by minimizing an occupying area of elements other than the photo diode in a pixel portion by sharing a transistor among a plurality of pixels. By using this pixel sharing technology, characteristics such as a saturation signal amount and sensitivity of a photo diode can be improved (refer to Patent Documents 1 to 4).

In the above-described structure, a layer formed with a transistor is formed as an epitaxial layer on a layer formed with the photo diode. Furthermore, as a method of transferring charge to a floating diffusion from a photo diode, adopted are a method of using a vertical transistor and an II plug method in which connection is made by ion implant (II).

CITATION LIST

Patent Document

Patent Document 1: Japanese Patent Application Laid-Open No. 2010-147965
Patent Document 2: Japanese Patent Application Laid-Open No. 2010-212288
Patent Document 3: Japanese Patent Application Laid-Open No. 2007-115994
Patent Document 4: Japanese Patent Application Laid-Open No. 2011-049446

SUMMARY OF THE INVENTION

Problems to be Solved by the Invention

Meanwhile, in the case of forming a back-illuminated type CMOS image sensor including an embedded photo diode in the related art by utilizing a technology described above, a structure in which the photo diode and a floating diffusion are vertically stacked relative to a pixel plane is formed. Therefore, as for a channel to transfer charge from the photo diode to the floating diffusion, it is necessary to form a transfer channel vertical to the pixel plane, such as a vertical transistor or an II plug to make connection by II.

However, when the transfer channel is vertically formed, an entire transfer channel becomes long. Therefore, transfer characteristics of charge to become a pixel signal may be degraded. Additionally, the embedded photo diode is needed to be formed after securing a region to form II plug in order to secure the transfer channel, and a layout pattern in a layer to be formed with the photo diode may be restricted. Furthermore, since the embedded photo diode is needed to be formed before forming a transfer gate, self-alignment II (ion implant) cannot be used, and robustness against alignment between the photo diode and floating diffusion, which are to be vertically stacked, may be degraded.

The present technology is made in view of the above-described situations, and particularly intended to suppress degradation of the transfer characteristics by achieving a configuration in which the transfer channel is formed in parallel to the pixel plane (horizontal direction) by forming the floating diffusion at the same depth as the photo diode.

Solutions to Problems

A back-illuminated type solid-state imaging device according to an aspect of the present technology includes: a pixel transistor formed on a first layer; a photo diode formed on a second layer separated from the first layer in a depth direction; and a transfer transistor adapted to control charge transfer of the photo diode, and the transfer transistor is formed in a manner embedded in the first layer.

A gate of the transfer transistor may be formed in the second layer.

The floating diffusion adapted to detect charge transferred from the photo diode can be further included, and the floating diffusion is formed at a position including the second layer.

A portion of the floating diffusion is formed to have a depth same as a portion of the photo diode relative to a light incident direction, and a channel that is opened/closed by control of the transfer transistor may be formed between the portion of the floating diffusion and the portion of the photo diode having the same depth.

The floating diffusion has an entire configuration as one integrated body, penetrates the first layer, and may be formed at a position including the second layer.

The floating diffusion may be formed in a separate manner in each of the first layer and the second layer.

The floating diffusion is formed in the second layer, and a contact that electrically connects the floating diffusion may be formed by excavation so as to penetrate the first layer.

An oxide film may be formed in the first layer at a position adjacent to each of a drain and a source of the pixel transistor in a manner interposing the pixel transistor.

An embedded oxide film may be formed in the second layer as a continuous configuration at a position corresponding to the oxide film of the first layer.

A front surface side pinning layer of the photo diode on the second layer, which is provided as a boundary surface between the first layer and the second layer, may be formed by p type epitaxial growth.

The front surface pinning layer may be formed by in-site doped Epi growth.

An oxide film having a thickness of a gate oxide film or larger may be formed between the floating diffusion and the transfer transistor gate.

The floating diffusion is formed in the second layer, and metal wiring that electrically connects the floating diffusion may be formed by excavation so as to penetrate the first layer.

An oxide film having a thickness of a gate oxide film or larger may be formed in a manner surrounding the transfer transistor gate.

Only a bottom portion of the transfer transistor gate may be formed in a manner extending across the floating diffusion and the photo diode, and other portions may be formed to have a diameter smaller than the bottom portion.

In a manufacturing method of a back-illuminated type solid-state imaging device according to an aspect of the present technology, the back-illuminated type solid-state imaging device includes: a pixel transistor formed on a first layer; a photo diode formed on a second layer separated from the first layer in a depth direction; and a transfer transistor adapted to control charge transfer of the photo diode, and the transfer transistor is formed in a manner embedded in the first layer. The manufacturing method includes: forming a first later, and then forming an excavated portion in the first layer such that a gate of the transfer transistor is formed in the second layer; and forming the transfer transistor in the excavated portion such that the gate is formed in the second layer.

An electronic device provided with the back-illuminated type solid-state imaging device according to an aspect of the present technology includes: pixel transistor formed on a first layer; a photo diode formed on a second layer separated from the first layer in a depth direction; and a transfer transistor adapted to control charge transfer of the photo diode, and the transfer transistor is formed in a manner embedded in the first layer.

According to an aspect of the present technology, the pixel transistor is formed on the first layer, the photo diode is formed on the second layer separated from the first layer in the depth direction, charge transfer of the photo diode is controlled by the transfer transistor, and the transfer transistor is formed in the first layer in an embedded manner.

Effects of the Invention

According to an aspect of the present technology, degradation of the transfer characteristics of charge accumulated in the photo diode can be suppressed. Furthermore, it is possible to reduce restrictions on the pattern of the layer formed with the photo diode in order to secure the transfer channel. Moreover, degradation of robustness against mutual alignment between the pixel transistor and the layer formed with the photo diode can be suppressed.

MODE FOR CARRYING OUT THE INVENTION

Note that a description will be provided in the following order.

1. First Embodiment (Example of Forming Floating Diffusion by Performing Excavation up to Layer Formed with photo diode)

2. Second Embodiment (Example of Forming Floating Diffusion in Separate Manner in Each of Layer Formed with Photo diode and Layer Formed with Pixel Transistor)

3. Third Embodiment (Example Forming Floating Diffusion on Layer Formed with Photo Diode and Excavating Contact on Epitaxial Layer)

4. Fourth Embodiment (Example of Forming Oxide Film in Manner Interposing Pixel Transistor)

5. Fifth Embodiment (Example of Forming Oxide Film in Manner Interposing Pixel Transistor and Additionally Forming Excavated Oxide Film Connected to Silicon Substrate Formed with Photo Transistor)

6. Sixth Embodiment (Example of Forming Front Surface Pinning Layer by In-Site Doped Growth)

7. Seventh Embodiment (Example of Forming Oxide Film between Transfer Transistor Gate and Floating Diffusion)

8. Eighth Embodiment (Example of Forming Oxide Film between Transfer Transistor Gate and Floating Diffusion and Adopting FD Contact As Metal Wiring)

9. Ninth Embodiment (Example of Forming Oxide Film Not Only between Gate of Transfer Transistor and Floating Diffusion But Also around Gate)

10. Tenth Embodiment (Example of Forming Oxide Film Not Only between Transfer Transistor Gate and Floating Diffusion But Also around Gate and Adopting Gate Bottom Portion As Execution Width and Forming Other Portions Thin)

11. Eleventh Embodiment (Exemplary Configuration of Electronic Device Provided with Imaging Device Including Solid-state Imaging Device of Present Technology)

1. First Embodiment

Figure 1:
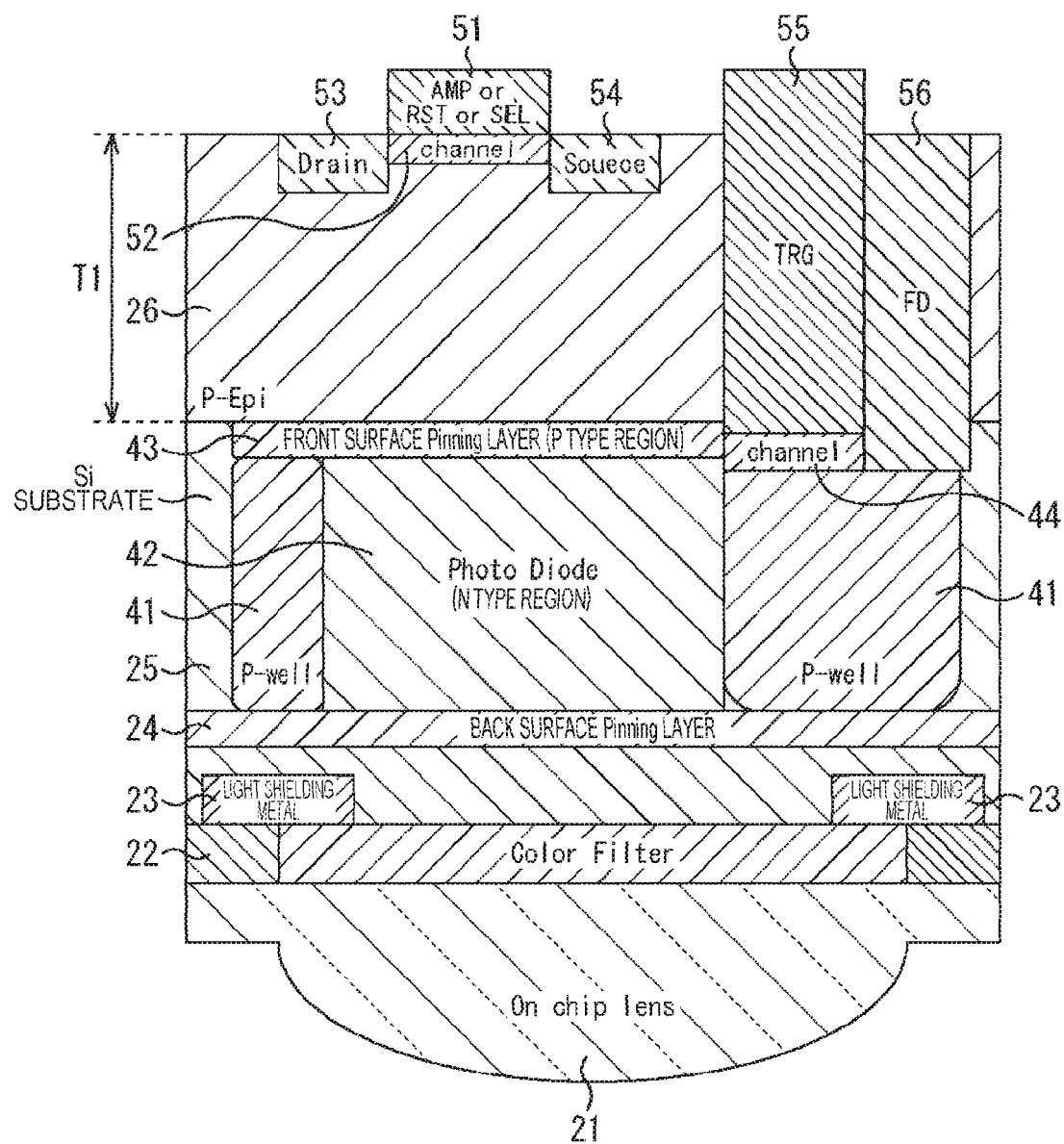
FIG. 1 is an explanatory diagram for an exemplary configuration of a solid-state imaging device according to a first embodiment of the present technology.

FIG. 1 is a diagram illustrating an exemplary configuration of a first embodiment of a solid-state imaging device applying the present technology. Note that the solid-state imaging device in FIG. 1 is a back-illuminated type solid-state imaging device. In FIG. 1, note that a traveling direction (depth direction) of incident light to the solid-state imaging device is directed from a lower side to an upper side in the drawing, and an upper surface in each layer in the drawing is a front surface and a lower surface is a back surface in the following. Therefore, a lower portion in the drawing is a deep position while an upper portion in the drawing is a shallow position. Furthermore, FIG. 1 is a side surface cross-sectional view illustrating one pixel of the solid-state imaging device.

An on chip lens 21 is provided at a head position of the traveling direction of the incident light from a bottom of the drawing, and the incident light is condensed so as to be received by a photo diode 42.

On the on chip lens 21 in the drawing, a color filter 22 is provided and transmits light, to the photo diode 42, light having a predetermined wavelength out of light entering via the on chip lens 21.

Around the color filter 22, a light shielding metal 23 is provided, and the light shielding metal 23 performs light shielding such that the light having passed through the on chip lens 21 and the color filter 22 does not enter the photo diodes 42 of other adjacent pixels.

On the color filter 22 in the drawing, a back surface pinning layer 24 is provided and formed as an element isolation layer between a silicon (Si) substrate 25 and the color filter 22.

The photo diode (PD) 42 formed of an N type region is formed on the silicon substrate 25 in a center portion of the drawing, and a separation layer 41 is formed around the photo diode. Thus, the photo diode 42 has an embedded configuration, and generates charge in accordance with a light amount of the incident light by a photoelectric effect, and then outputs the charge to a floating diffusion 56 via a channel 44 that is opened/closed by control of a transfer transistor gate 55.

On the silicon substrate 25 in the drawing, a front surface pinning layer 43 formed of a P type region is provided and formed as an element isolation layer between the silicon (Si) substrate 25 and an epitaxial layer (P-Epi) 26.

The epitaxial layer (P-Epi) 26 is formed on the silicon substrate 25, and a gate (AMP or RST or SEL) 51 of a pixel transistor, such as an amplification transistor (AMP), a reset transistor (RST), or a selection transistor (SEL), is provided thereon. Furthermore, a channel 52 is provided under the gate 51, and opened/closed by control of the gate 51, and adapted to connect a drain 53 to a source 54. Meanwhile, the configuration of the pixel transistor may be a configuration not including the selection transistor (SEL) depending on necessity.

Additionally, in the epitaxial layer 26, the transfer transistor gate (TRG) 55 adapted to control opening/closing of the channel 44 above the channel 44 of the silicon substrate 25 in a manner embedded and penetrating the ekitapixel layer 26. Furthermore, the floating diffusion 56 is provided in a manner contacting a side surface portion of the channel 44 and penetrating the epitaxial layer 26.

In other words, as illustrated in FIG. 1, provided is the configuration in which a bottom portion of the floating diffusion 56 in the drawing is formed in a manner penetrating the epitaxial layer 26 so as to be located at a position same as an upper portion of the photo diode 42 in the drawing relative to the traveling direction (depth direction) of the incident light.

With this configuration, the channel 44 is formed as a transfer channel to transfer charge accumulated by the photo diode 42 to the floating diffusion 56, and is opened/closed by control of the transfer transistor gate 55. Consequently, a transfer distance does not become long because the transfer channel is formed in a vertical direction relative to the traveling direction (depth direction) of the incident light (direction parallel to a pixel surface) via the channel 44. As a result, since the transfer distance does not become long, degradation of transfer characteristics can be reduced. Furthermore, since there is no need to provide the embedded photo diode 42 with an II plug, which is needed to secure the transfer channel, restrictions on a pattern, such as securing a region for the II plug on the silicon substrate 25, can be eliminated.

<Manufacturing Method of Solid-State Imaging Device in FIG. 1>

Next, a manufacturing method of the solid-state imaging device in FIG. 1 will be described with reference to a flowchart in FIG. 2.

Figure 3:
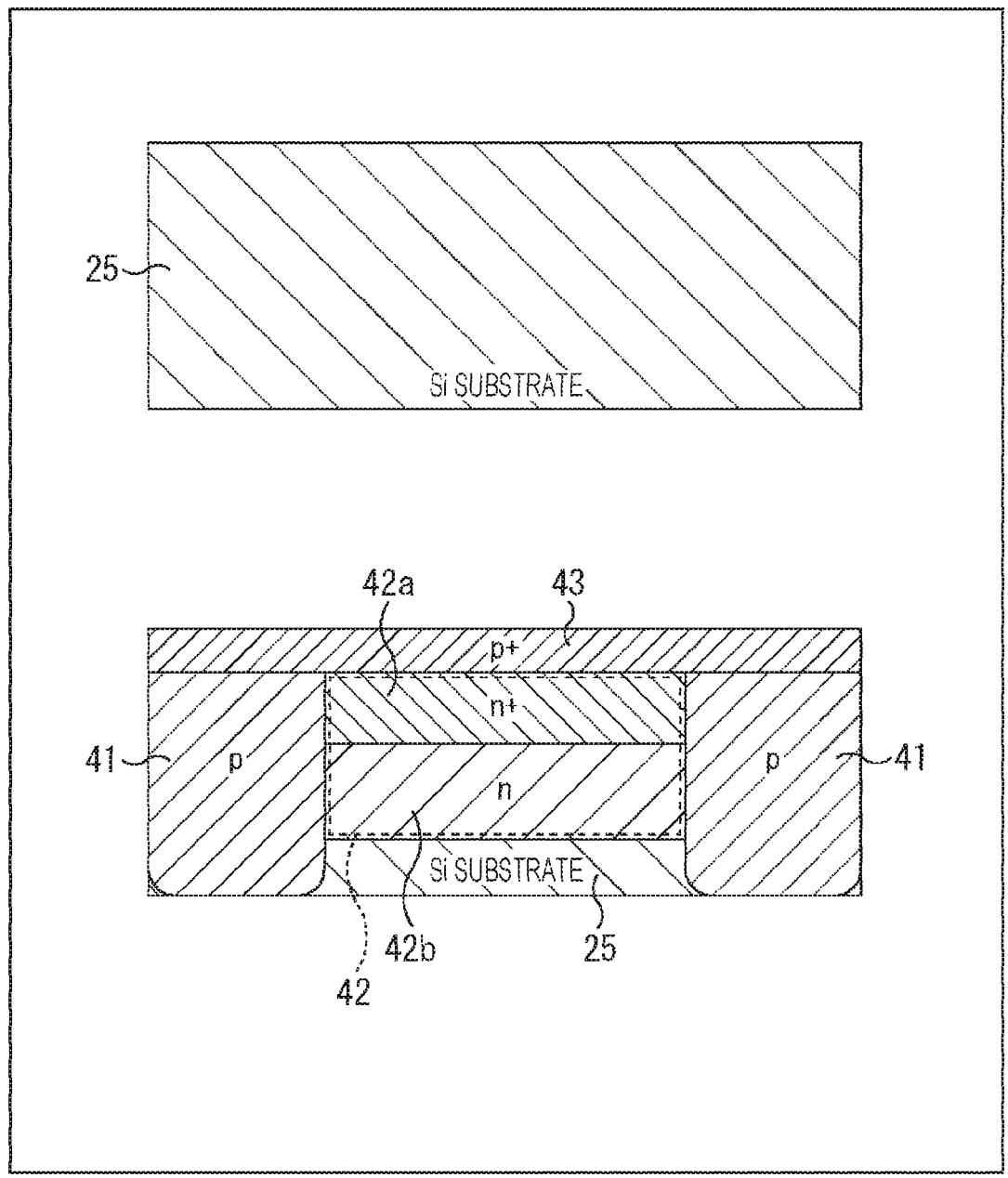
FIG. 3 is an explanatory diagram for the manufacturing method of the solid-state imaging device in FIG. 1.

In Step S11, the separation layer 41, photo diode 42, and front surface pinning layer 43 are formed on the n type silicon substrate (n-Si) 25. In other words, the separation layer (p) 41, photo diode 42, and front surface pinning layer (p+) 43 are formed as illustrated in a lower portion of FIG. 3 in the silicon substrate (n-Si) 25 as illustrated in an upper portion of FIG. 3. Meanwhile, as illustrated in the lower portion of FIG. 3, the photo diode 42 is formed of an n+ layer (n+) 42a and an n layer (n) 42b.

Figure 4:
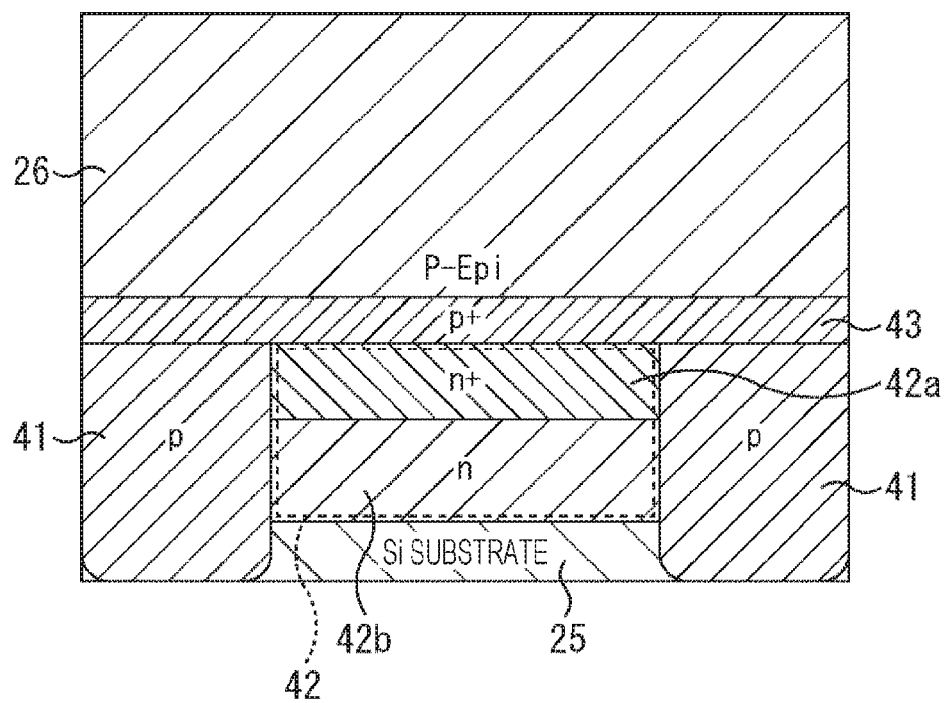
FIG. 4 is an explanatory diagram for the manufacturing method of the solid-state imaging device in FIG. 1.

In Step S12, the p type epitaxial layer (P-Epi) 26 is formed at an upper portion of the silicon substrate 25 in the drawing. In other words, as illustrated in FIG. 4, the epitaxial layer (P-Epi) 26 is formed at the upper portion of the silicon substrate 25 in the drawing, on which the separation layer (p) 41, photo diode 42, and front surface pinning layer (p+) 43 have been formed by the processing in Step S11. As illustrated in FIG. 4, the photo diode 42 is formed in an embedded manner in a state surrounded by the separation layer 41 and the epitaxial layer 26.

Figure 5:
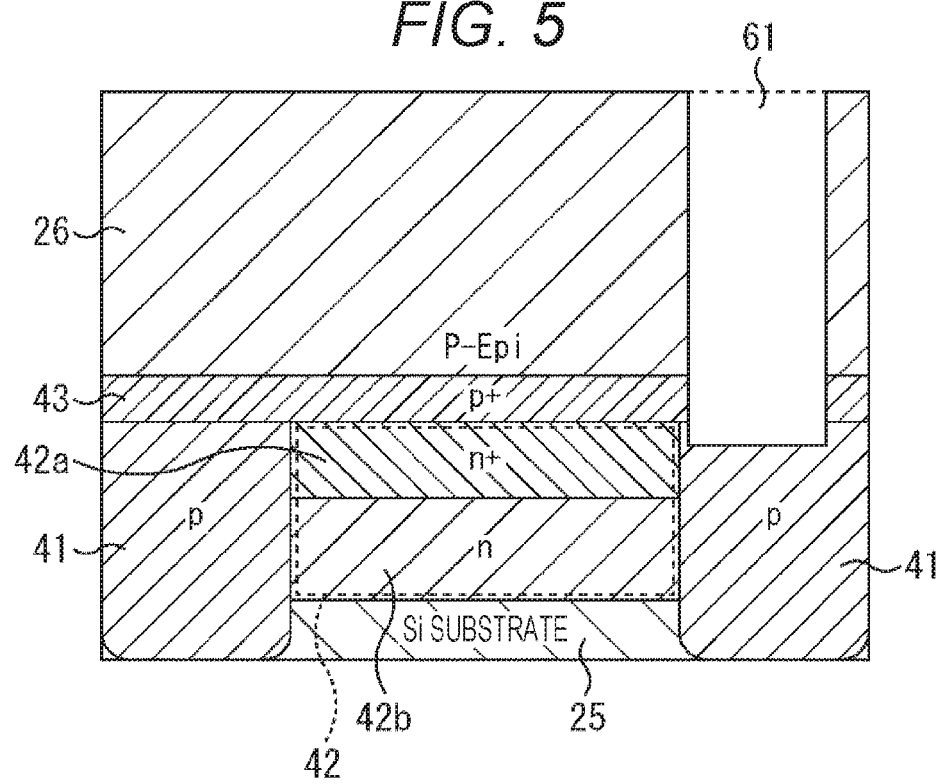
FIG. 5 is an explanatory diagram for the manufacturing method of the solid-state imaging device in FIG. 1.

In Step S13, an excavated portion to form the transfer transistor (TRG) gate 55 of the embedded type and the channel 44 is formed. In other words, as illustrated in FIG. 5, an excavated portion 61 is formed at a position in the epitaxial layer 26, where the transfer transistor gate (TRG) 55 and the channel 44 are to be formed, in a manner penetrating the epitaxial layer 26 up to a depth reaching the silicon substrate 25. At this point, the excavated portion 61 is located at a position contacting at least the n+ layer 42*a* to be an upper portion of the photo diode 42 and has a depth corresponding thereto.

Figure 6:
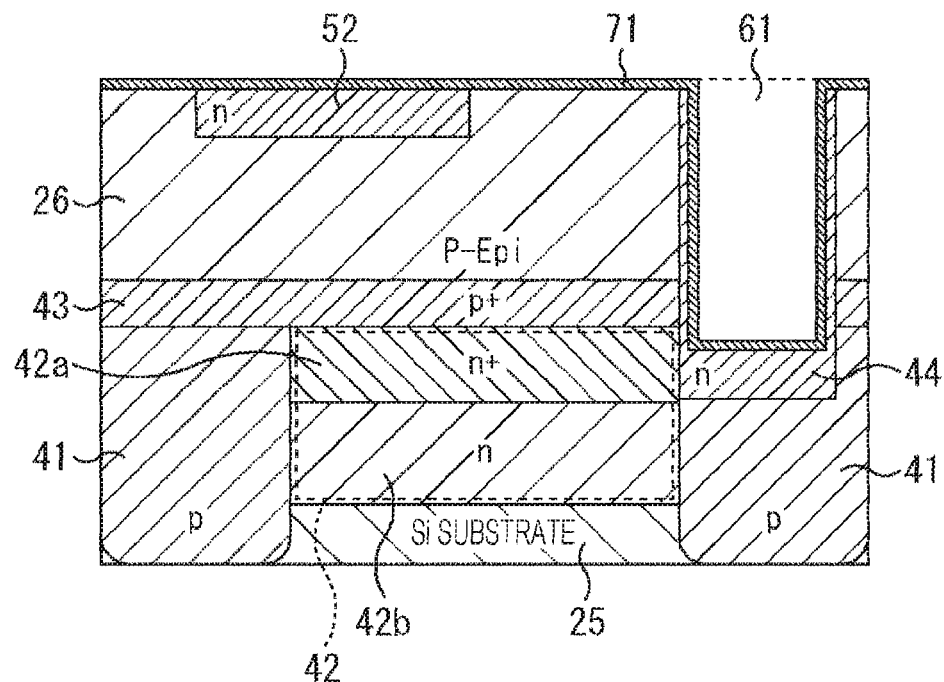
FIG. 6 is an explanatory diagram for the manufacturing method of the solid-state imaging device in FIG. 1.

In Step S14, the n type channel (n) 52 of the pixel transistor such as the amplification transistor (AMP), reset transistor (RST), or selection transistor (SEL), and the n type channel (n) 44 provided under the transfer transistor gate 55 are formed. Furthermore, an oxide film 71 is formed on the epitaxial layer 26 in the drawing. In other words, as illustrated in FIG. 6, the n type channel (n) 52 is formed at an upper portion of the epitaxial layer 26, and the channel (n) 44 is formed at a bottom portion of the excavated portion 61 respectively. Additionally, the oxide film 71 is formed on all over the channel (n) 52 and the channel (n) 44 from the upper side in the drawing. Meanwhile, the oxide film 71 is formed in FIG. 1 although not illustrated.

Figure 7:
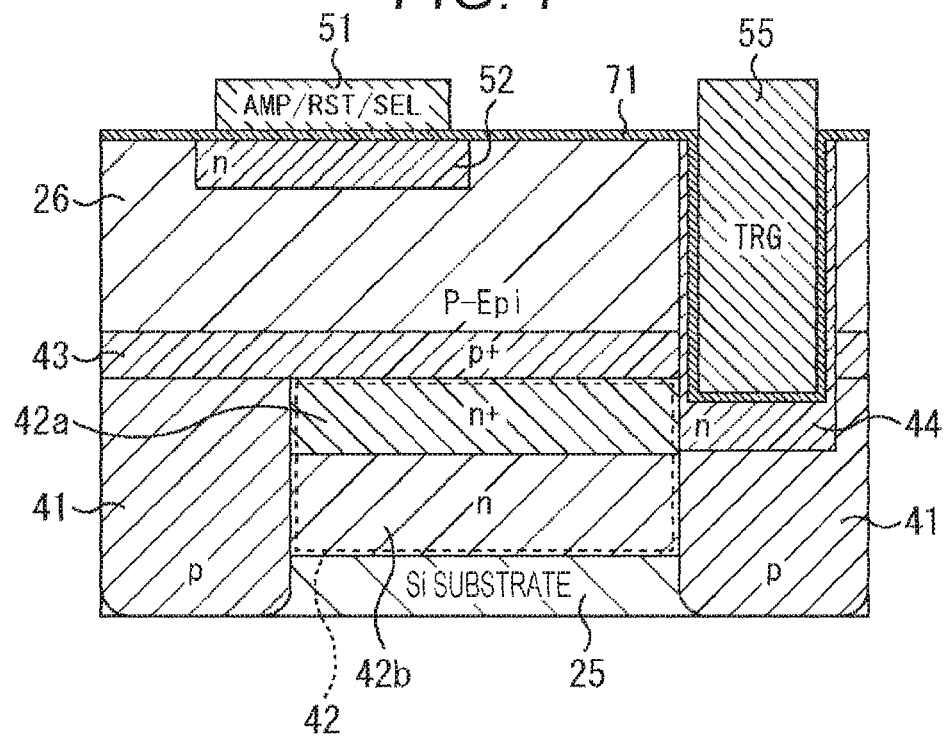
FIG. 7 is an explanatory diagram for the manufacturing method of the solid-state imaging device in FIG. 1.

In Step S15, the gate 51 of the pixel transistor such as the amplification transistor (AMP), reset transistor (RST), or selection transistor (SEL), and the transfer transistor gate (TRG) 55 are formed. In other words, as illustrated in FIG. 7, the gate (AMP/RST/SEL) 51 is formed on the channel (n) 52, and the transfer transistor gate 55 is formed at a position corresponding to the excavated portion 61.

Figure 8:
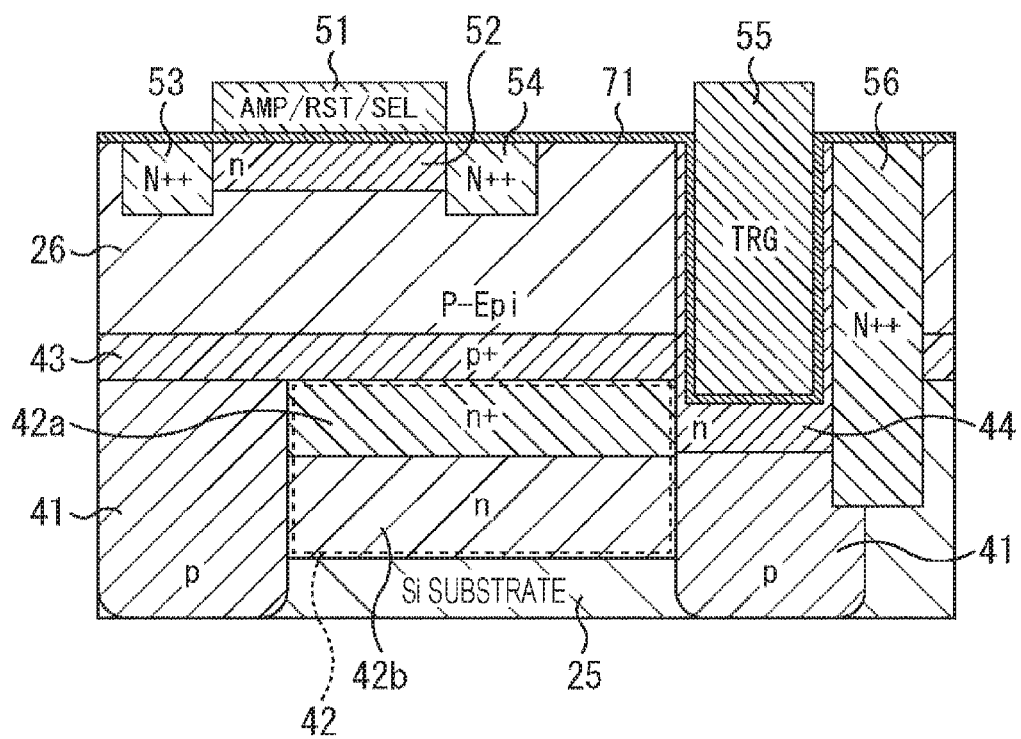
FIG. 8 is an explanatory diagram for the manufacturing method of the solid-state imaging device in FIG. 1.

In Step S16, the drain (N++) 53 and the source (N++) 54 of the pixel transistor such as the amplification transistor (AMP), reset transistor (RST), or selection transistor (SEL), and the floating diffusion (N++) 56 are formed. In other words, as illustrated in FIG. 8, the drain (N++) 53 and the source (N++) 54 are formed at both end portions of the channel 52. Additionally, as illustrated in FIG. 8, the floating diffusion (N++) is formed in a manner contacting at least the channel 44.

In the following, the solid-state imaging device as illustrated in FIG. 1 is manufactured by providing the back surface pinning layer 24, light shielding metal 23, color filter 22, and on chip lens 21 at a lower portion of the silicon substrate 25 in the drawing.

By manufacturing the solid-state imaging device in the above-described manufacturing method, the floating diffusion 56 having the depth reaching the upper portion of the photo diode 42 is formed, and also the channel 44 connecting these components is formed. Therefore, the charge transfer channel from the photo diode 42 can be secured in the vertical direction (horizontal direction in the drawing) relative to the depth direction (vertical direction in the drawing).

As a result, degradation of transfer characteristics caused by an elongated transfer distance can be reduced because the transfer channel is formed in the depth direction (vertical direction). Furthermore, since there is no need to form any II plug in order to secure the transfer channel at the time of forming the embedded photo diode 42, restrictions on a pattern therefor can be eliminated.

Meanwhile, the front surface pinning layer 43 as the element isolation layer between the epitaxial layer 26 and the silicon substrate 25 is formed by impurity implantation. However, in the case where the epitaxial layer 26 is the P type (P-Epi) as illustrated in FIG. 1, when the epitaxial layer has a sufficient P type concentration capable of separating the photo diode 42 from the pixel transistor (formed of gate 51, channel 52, drain 53, and source 54), there is no need to form the front surface pinning layer 43 by implanting P type impurities, and in this case, the step of forming the front surface pinning layer 43 can be omitted as well.

In other words, in the case where the epitaxial layer 26 has a low concentration of the n type or p type, it is necessary to form the front surface pinning layer (well) 43 to separate the photo diode 42 from the transistor (formed of gate 51, channel 52, drain 53, and source 54) by implanting the P type impurities.

Furthermore, the transfer transistor gate 55 may be formed by excavation after forming the epitaxial layer 26 or may also be formed by forming the epitaxial layer 26 by selective growth before forming the epitaxial layer 26. In the latter case, before forming the epitaxial layer 26, the photo diode 42 can be formed by ion implant (II) implantation by self-alignment using the transfer transistor gate 55 after processing the transfer transistor gate 55, and degradation of robustness against mutual alignment between the photo diode 42 and the transfer transistor gate 55 can be suppressed. Therefore, a design of a periphery of the transfer transistor gate 55 can be made to a state close to a structure in the related art in which arrangement is made on the same plane, and the restrictions on a pattern in order to secure the transfer channel in the vertical direction can be liberalized.

Additionally, as for the floating diffusion 56 also, even in the case of forming the floating diffusion before or after forming the epitaxial layer 26, the floating diffusion may be formed by performing II implantation to make connection or may be formed by multi-stage implantation after forming the epitaxial layer 26 in either case.

Furthermore, an area of the photo diode can be enlarged by separately forming the layer formed with the photo diode and the layer formed with the pixel transistor in the light incident direction of the incident light (depth direction). Therefore, sensitivity and pixel capacity Qs can be improved. Moreover, since respective pixels can be arranged in a perfect symmetric manner, an inter-pixel difference can be improved. Additionally, degradation of transfer characteristics unique to a vertical transfer can be improved by securing, on the silicon substrate 25, the transfer channel in the vertical direction (vertical to the depth direction) relative to the light incident direction of the incident light by using the transfer transistor gate 55 embedded in the epitaxial layer 26.

Furthermore, since the area where the pixel transistor can be arranged is enlarged, a sufficient length and a sufficient width can be secured for a size of a photo diode constituting each pixel. Therefore, influence caused by the pixel transistor can be reduced by random noise.

2. Second Embodiment

An example of forming an epitaxial layer 26 such that a bottom portion of a floating diffusion 56 becomes the same depth as an upper portion of a photo diode 42 has been described above. However, since only a transfer channel of charge from the photo diode 42 is needed to be secured in a vertical direction (horizontal direction in FIG. 1) relative to a depth direction, it may also be possible to have a configuration in which a sub-floating diffusion is provided separately from the floating diffusion 56 in a manner that the sub-floating diffusion is located at a position contacting a channel 44 connected to the photo diode 42 so as to establish mutual electrical connection therebetween.

Figure 9:
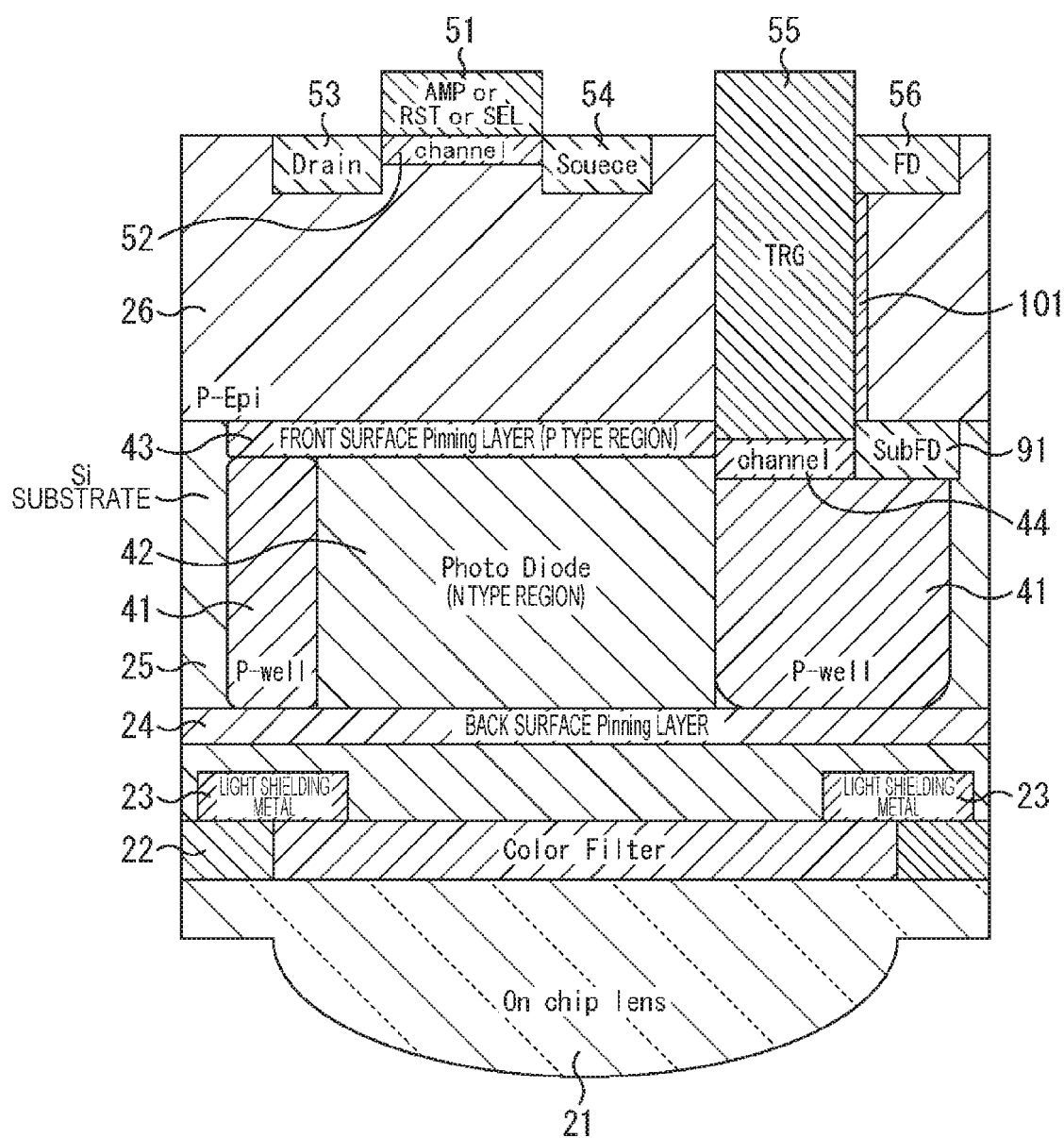
FIG. 9 is an explanatory diagram for an exemplary configuration of a solid-state imaging device according to a second embodiment of the present technology.

FIG. 9 is an exemplary configuration of a solid-state imaging device having a configuration in which sub-floating diffusion (SubFD) 91 is provided at a position and a depth contacting the channel 44 connected to the photo diode 42, and connected to the floating diffusion (FD) 56 via a channel 101. Note that a component having a function same as a component of a solid-state imaging device in FIG. 1 has the same name and is denoted by the same reference sign, and a description therefor will be suitably omitted.

In other words, in the solid-state imaging device of FIG. 9, the sub-floating diffusion 91 is located at a depth substantially same as an upper portion of the photo diode 42 and provided at the position contacting the channel 44. Therefore, the transfer channel of charge from the photo diode 42 can be set in the vertical direction (horizontal direction in FIG. 9) relative to the depth direction. With this configuration, effects similar to the solid-state imaging device in FIG. 1 can be obtained.

Figure 2:
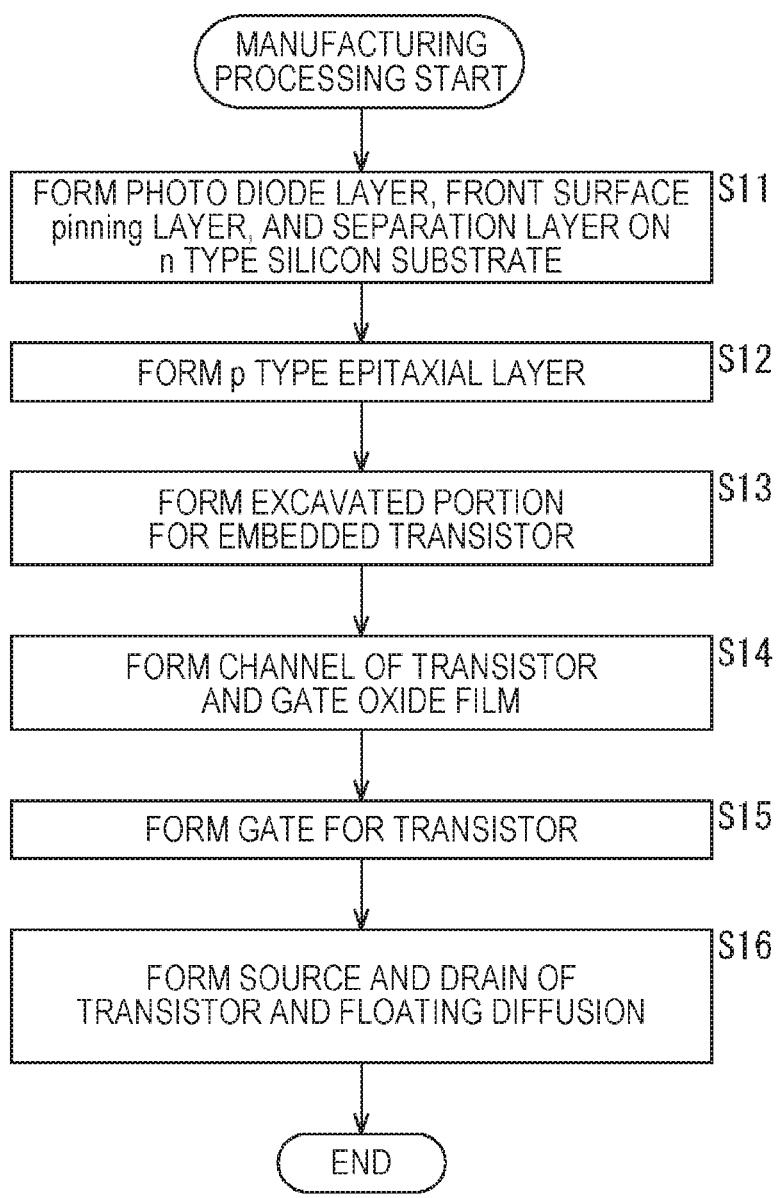
FIG. 2 is a flowchart to describe a manufacturing method of the solid-state imaging device in FIG. 1.

Additionally, in the case of the solid-state imaging device in FIG. 2, provided is the structure in which the sub-floating diffusion 91 is physically separated from the floating diffusion 56 all the time except for transferring time. Therefore, degradation of conversion efficiency caused by capacity increase of the floating diffusion 56 can be reduced.

Moreover, since the configuration in which a potential difference is held between the sub-floating diffusion 91 and the floating diffusion 56 via the channel 101 is provided, influence on an afterimage or pump-up deterioration can be reduced.

3. Third Embodiment

Since only a transfer channel of charge from a photo diode 42 is needed to be secured in a vertical direction (horizontal direction in the drawing) relative to a depth direction, a floating diffusion 56 may be provided on a silicon substrate 25 in a manner located at a position and a depth contacting a channel 44 connected to the photo diode 42. In this case, an epitaxial layer 26 is formed on the silicon substrate 25, and then an excavated portion is formed in a manner contacting the floating diffusion 56, and a contact may be provided at this excavated portion.

Figure 10:
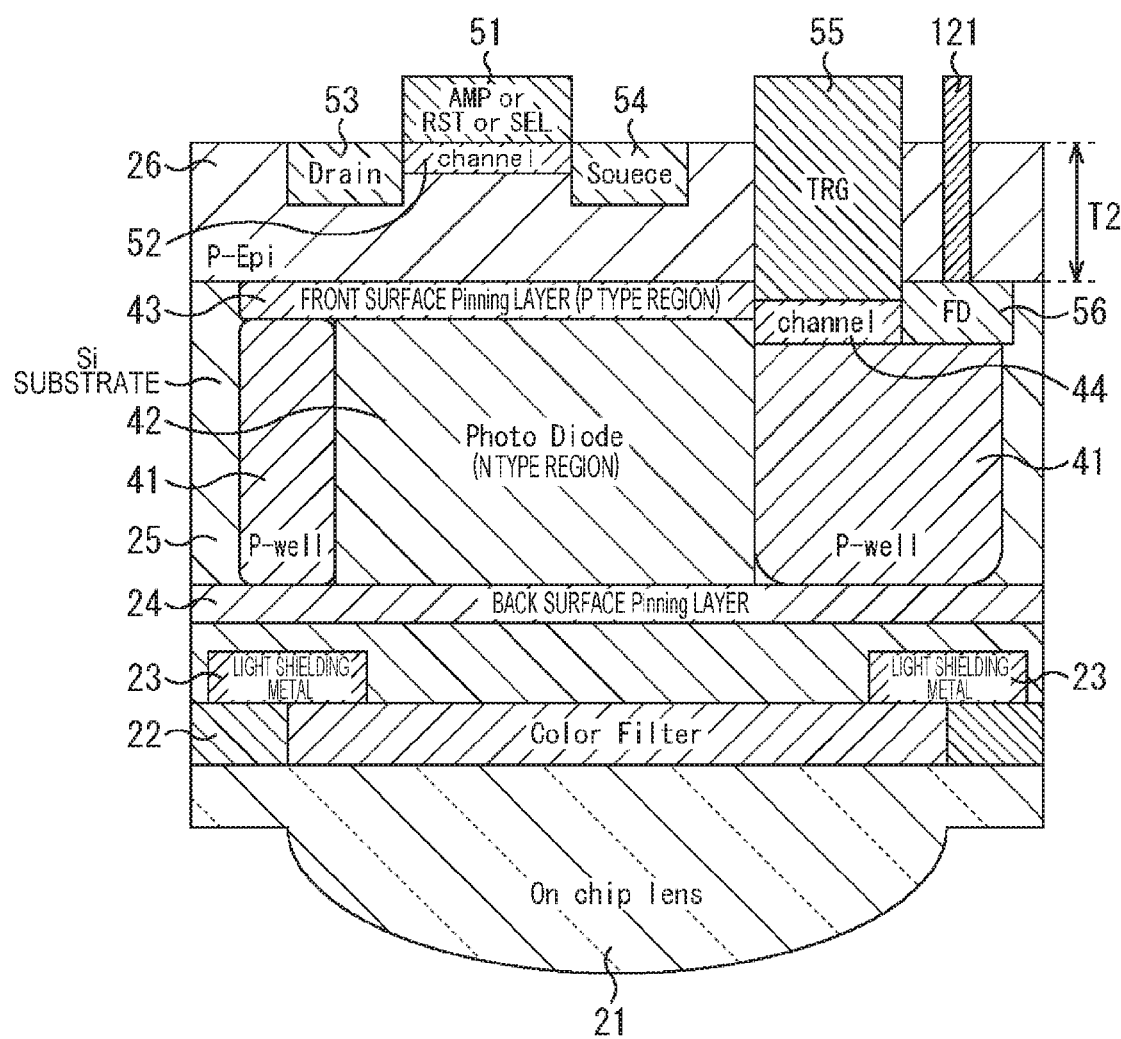
FIG. 10 is an explanatory diagram for an exemplary configuration of a solid-state imaging device according to a third embodiment of the present technology.

FIG. 10 is an exemplary configuration of a solid-state imaging device in which the epitaxial layer 26 is formed after the floating diffusion 56 is formed on the silicon substrate 25, and also the excavated portion is provided at the epitaxial layer 26 so as to reach the floating diffusion 56, and a contact 121 is provided in a manner contacting the floating diffusion 56.

In the solid-state imaging device of FIG. 10, the contact 121 can be shortened in a vertical direction by thinning the epitaxial layer 26. Therefore, degradation of transfer characteristics can be suppressed. In other words, a thickness T2 of the epitaxial layer 26 in FIG. 10 can be made thinner than a thickness T1 (>T2) of an epitaxial layer 26 in FIG. 1. Furthermore, since the floating diffusion 56 is formed on the silicon substrate 25, a positional relation with the photo diode 42 in the horizontal direction can be made close to a structure and design in the related art.

Meanwhile, in the case of using the contact 121, the floating diffusion 56 may be formed only on the silicon substrate 25 as illustrated in FIG. 10, or may also be formed by performing II a plurality of times before/after forming the epitaxial layer 26 like a solid-state imaging device in FIG. 1, and either one thereof can be selected. Meanwhile, since the floating diffusion 56 is formed by performing II the plurality of times before/after the epitaxial layer 26, the epitaxial layer 26 can be formed thin, and the length of the contact 121 can be more shortened.

4. Fourth Embodiment

An oxide film may also be used to separate a pixel transistor (formed of gate 51, channel 52, drain 53, and source 54) such as an amplification transistor (AMP), a reset transistor (RST), or a selection transistor (SEL), a transfer transistor gate 55, and a floating diffusion 56.

Figure 11:
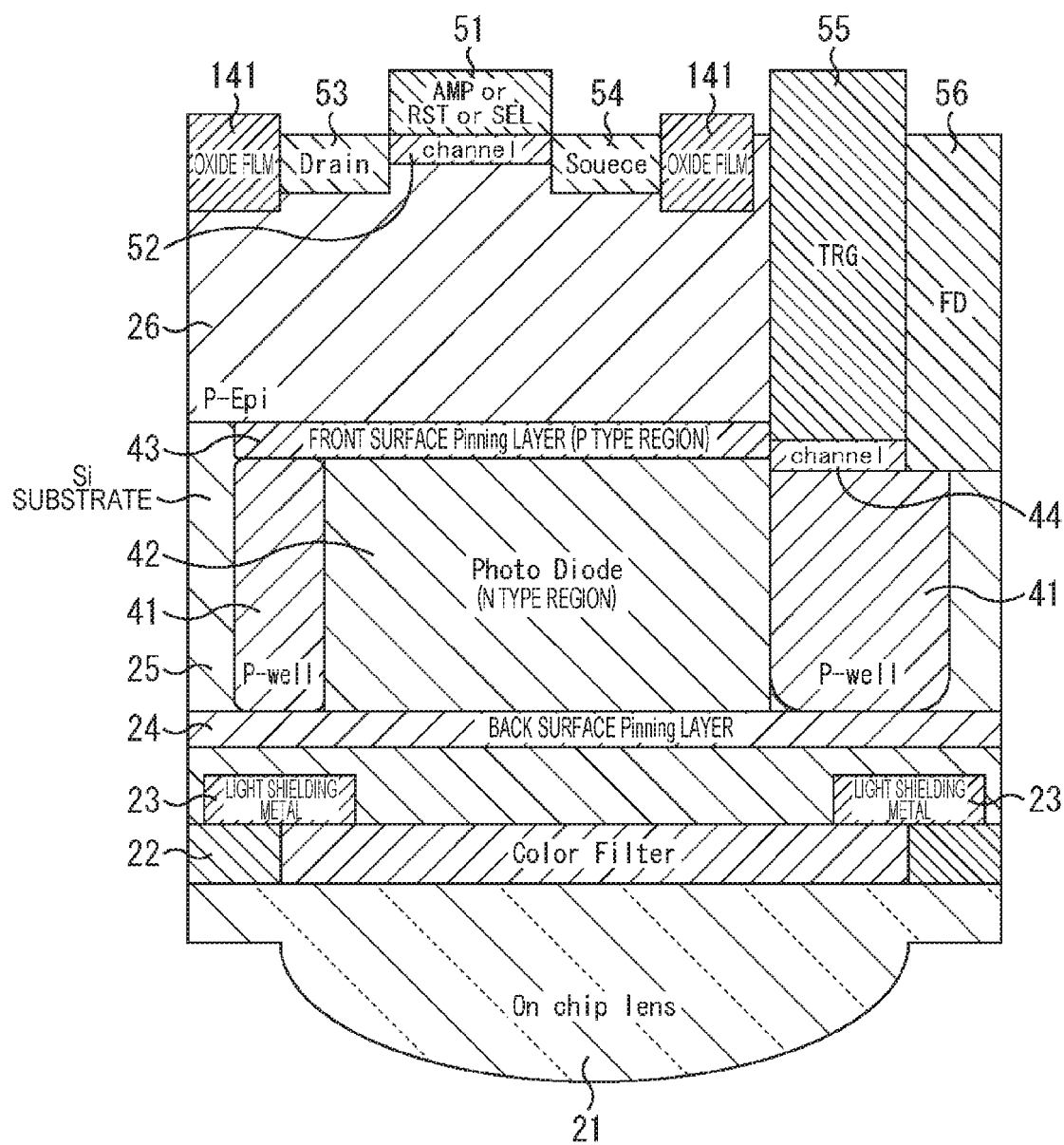
FIG. 11 is an explanatory diagram for an exemplary configuration of a solid-state imaging device according to a fourth embodiment of the present technology.

FIG. 11 illustrates an exemplary configuration of a solid-state imaging device in which an oxide film is used to separate the pixel transistor (formed of gate 51, channel 52, drain 53, and source 54) such as the amplification transistor (AMP), reset transistor (RST), or selection transistor (SEL), the transfer transistor gate 55, and the floating diffusion 56.

In other words, oxide films 141 are provided as element isolation layers respectively at a left end portion of the drain 53 and a right end portion of the source 54 on the epitaxial layer 26 in FIG. 11.

This can suppress color mixture and smearing between adjacent pixels, and furthermore conversion efficiency can be improved compared to separation by II because capacity is reduced by adopting separation by the oxide film.

5. Fifth Embodiment

In a fourth embodiment, a description has been given for an example of providing oxide films 141 as element isolation layers respectively at a left end portion of a drain 53 and a right end portion of a source 54 on an epitaxial layer 26. However, it may also be possible to have a configuration in which the oxide film 141 provided at the left end portion of the drain 53 is further extended to a silicon substrate 25 side to form an embedded oxide film also inside the silicon substrate 25 and adjacent pixels are completely separated from each other.

Figure 12:
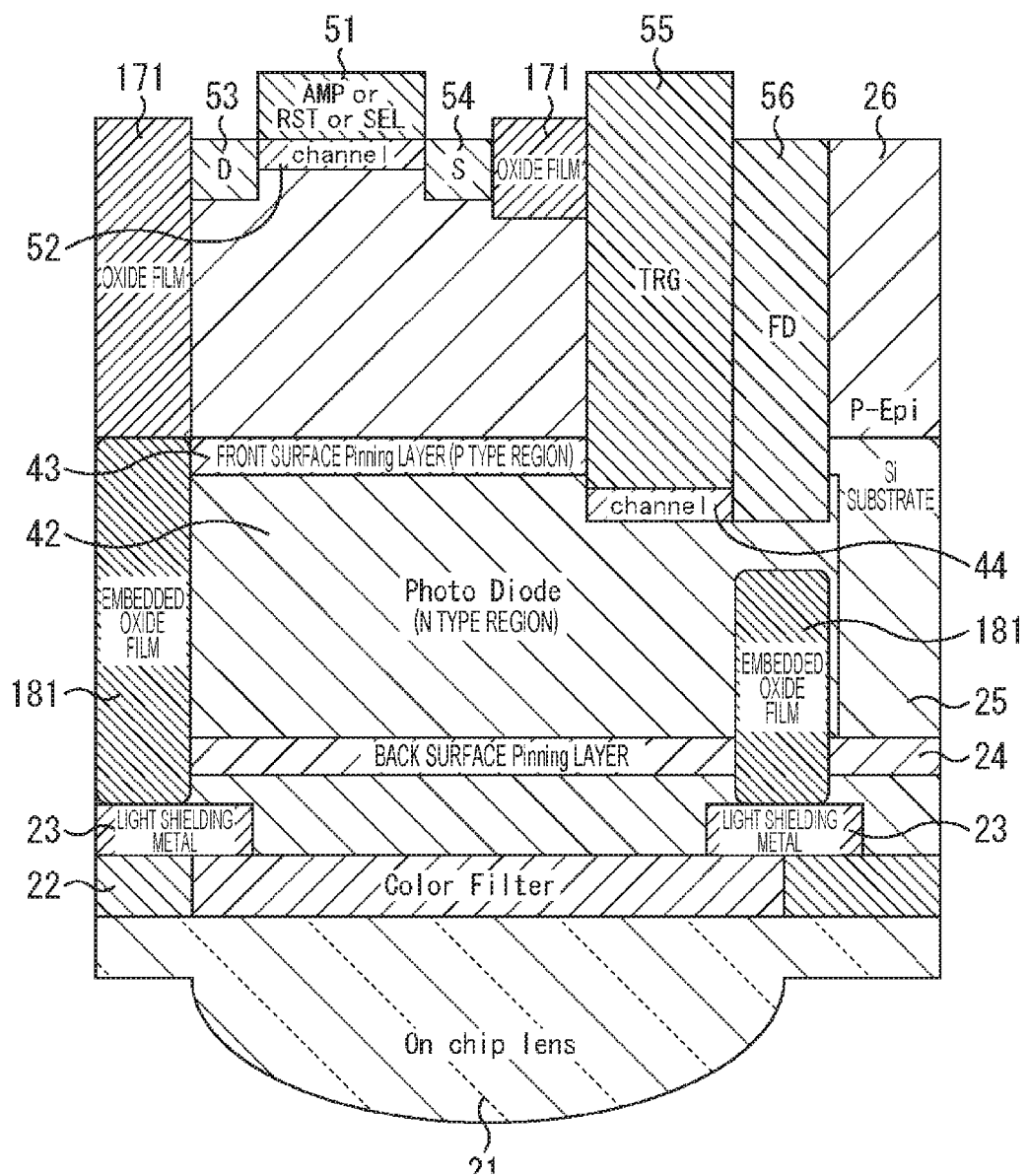
FIG. 12 is an explanatory diagram for an exemplary configuration of a solid-state imaging device according to a fifth embodiment of the present technology.

FIG. 12 illustrates an exemplary configuration of a solid-state imaging device in which the oxide film 141 is formed in a manner extending to the silicon substrate 25 side and the embedded oxide film is formed inside the silicon substrate 25 at the position thereof.

In other words, in the solid-state imaging device of FIG. 12, an oxide film 171 obtained by extending the oxide film 141 from the left end portion of the drain (D) 53 to the silicon substrate 25 is provided, and additionally an embedded oxide film 181 is provided inside the silicon substrate 25 so as to be connected to the oxide film 171. Furthermore, the embedded oxide film 181 has a configuration contacting a light shielding metal 23. Moreover, the embedded oxide film 181 is also provided at a right end portion of a photo diode 42 and has a similar configuration contacting the light shielding metal 23. Additionally, the oxide film 171 is provided at the right end portion of the source (S) 54.

With this configuration, color mixture and smearing can be suppressed inside the silicon substrate 25 between the adjacent pixels. Additionally, the embedded oxide film 181 can completely separate the adjacent pixels from each other by being connected to the oxide film 171 of the epitaxial layer 26. Furthermore, as the embedded oxide film 181, a material same as the light shielding metal 23 (for example, metal like W (tungsten)) may also be embedded.

Moreover, since the embedded oxide film 181 is connected to the light shielding metal 23, light condensed by an on chip lens 21 is suppressed from being transmitted to the adjacent pixels. Therefore, the light can be made to enter the photo diode 42 inside the silicon substrate 25. As a result, sensitivity of the photo diode 42 can be improved.

6. Sixth Embodiment

A front surface pinning layer (impurity diffusion layer) in the vicinity of an interface between a silicon substrate 25 and an epitaxial layer (P-Epi) 26 may be formed by in-situ doped Epi growth.

Figure 13:
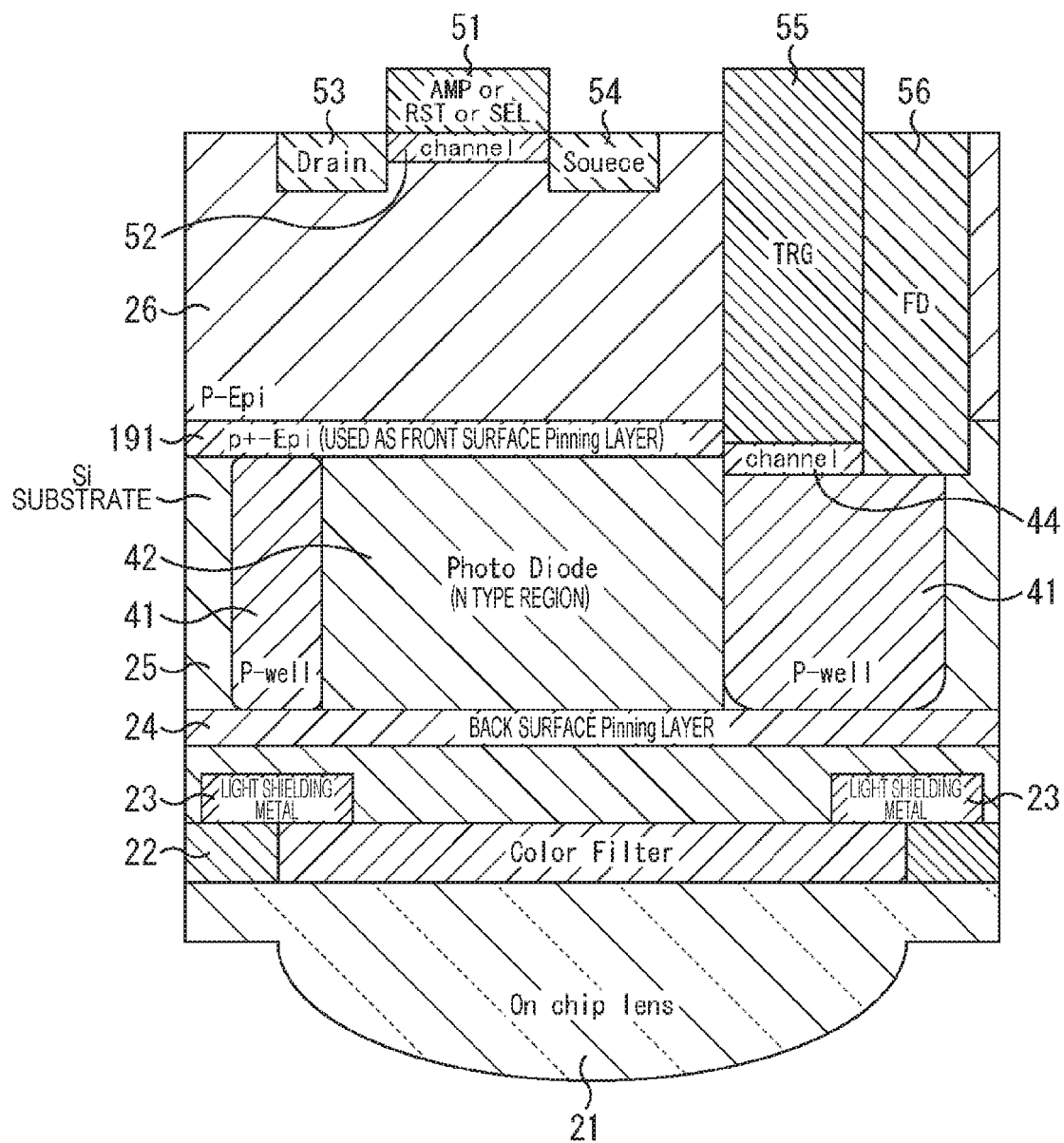
FIG. 13 is an explanatory diagram for an exemplary configuration of a solid-state imaging device according to a sixth embodiment of the present technology.

FIG. 13 illustrates an exemplary configuration of a solid-state imaging device in which the front surface pinning layer (impurity diffusion layer) is formed by the in-situ doped Epi growth. In other words, FIG. 13 illustrates the exemplary configuration of the solid-state imaging device when a front pinning layer (p+-Epi) 191 is formed by the in-situ doped Epi growth.

Specifically, when epitaxial layer growth is started in order to form the epitaxial layer 26 after forming a photo diode 42 inside the silicon substrate 25 by impurity implantation, impurities in the vicinity of the interface are diffused by heat during the epitaxial layer growth (for example, heat of about 1000° C. that enables excellent epitaxial growth).

In this case, it is known that a PN junction in the vicinity the interface is hardly created with a steep profile, capacity of the PN junction is reduced, and capacity Qs of the photo diode 42 is reduced. Therefore, in the case where the in-situ doped Epi growth makes the epitaxial layer 26 grow while an implantation amount of an impurity portion is controlled in accordance with a growing state of the epitaxial layer 26, the epitaxial layer can be formed while keeping a desired steep profile.

As a result, the capacity Qs of the photo diode 42 is suppressed from being reduced.

7. Seventh Embodiment

Degradation of a conversion efficiency due to capacity increase of a floating diffusion 56 can be suppressed by arranging an oxide film having a thickness of a gate oxide film or larger between a gate 55 and the floating diffusion 56, and also an electrical filed between the gate 55 and the floating diffusion 56 may be relaxed.

Figure 14:
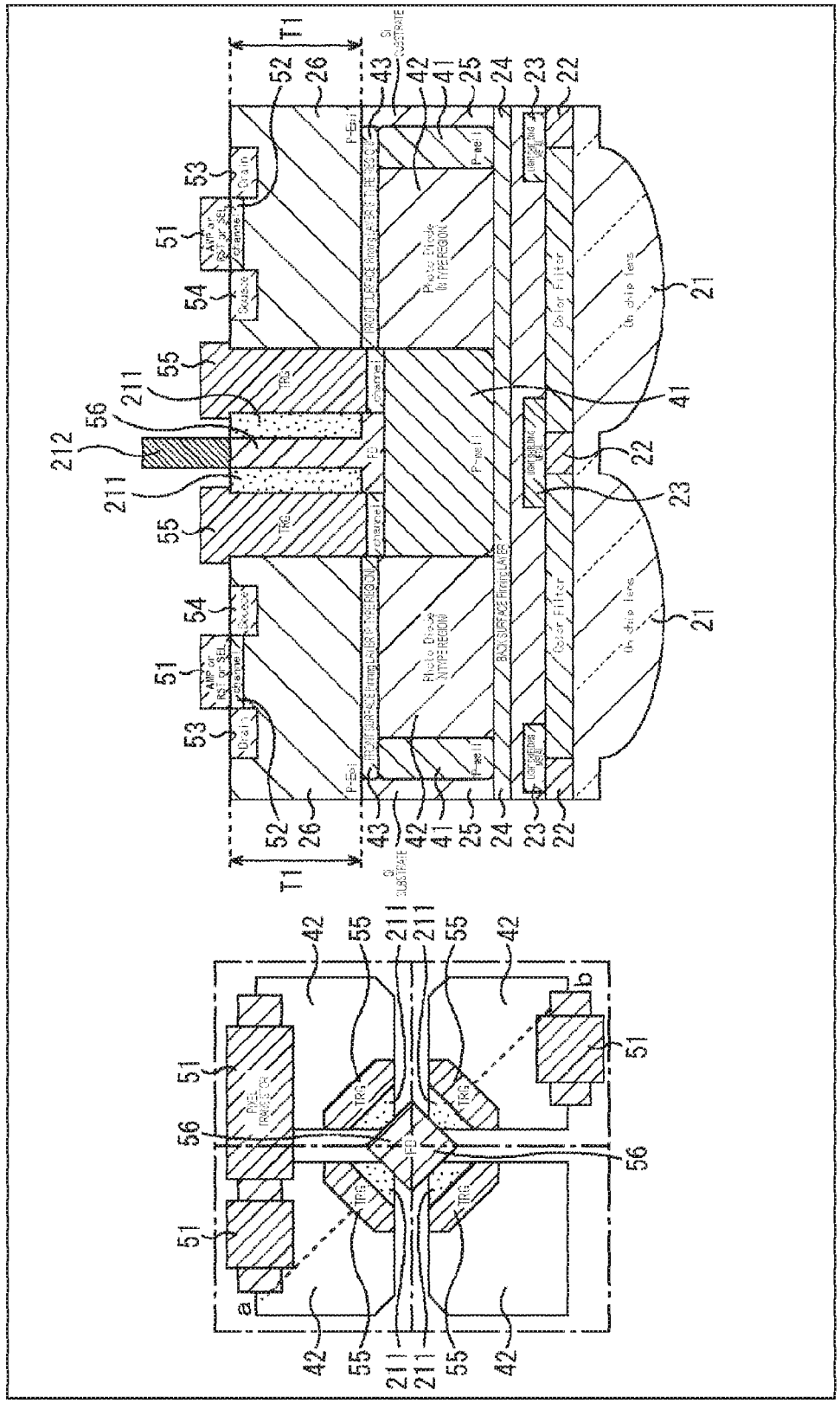
FIG. 14 is an explanatory diagram for an exemplary configuration of a solid-state imaging device according to a seventh embodiment of the present technology.

FIG. 14 illustrates an exemplary configuration of the solid-state imaging device in which, for example, SiO2 is arranged as the oxide film between the gate 55 and the floating diffusion 56. Note that a left portion in FIG. 14 is a top surface view of four pixels in a form of 2×2 pixels indicated by square shapes of one-dot-chain line at the time of sharing the floating diffusion 56 arranged in a center thereof. Additionally, a right portion in FIG. 14 is a cross-sectional view taken along a line a-b indicated by a dot line in the 2×2 pixels in the left portion of FIG. 14.

As illustrated in the left portion of FIG. 14, a transfer transistor gate 55 contacting the floating diffusion 56 provided at the center of 2×2 pixels and shared by the four pixels is provided at a corner portion of each of the pixels (photo diodes 42). Furthermore, an oxide film 211 formed of SiO2 is provided between the floating diffusion 56 and the gate 55. Additionally, pixel transistor gates 51 are provided at an upper side and a lower side of the 2×2 pixels in the drawing.

As illustrated in the right portion of FIG. 14, the oxide film 211 formed of SiO2 is provided between the floating diffusion 56 and the gate 55.

By adopting the configuration in which the oxide film (SiO2) having the thickness of the gate oxide film or larger is provided between the gate 55 and the floating diffusion 56, degradation of conversion efficiency caused by capacity increase of the floating diffusion 56 can be suppressed. Additionally, since the electrical field between the gate 55 and the floating diffusion 56 can be relaxed, reliability of the transfer transistor gate can be improved.

<Manufacturing Method of Solid-State Imaging Device in FIG. 14>

Next, a manufacturing method of the solid-state imaging device in FIG. 14 will be described with reference to FIG. 15. Note that it is assumed that the embedded photo diode 42 and the floating diffusion 56 are already formed.

In a first step, as illustrated in an upper left portion of FIG. 15, a trench is formed in a region to be formed with the oxide film 211 of the epitaxial layer 26, and subsequently SiO2 to form the oxide film 211 is filled into the trench. Note that the trench may also be an air gap.

Figure 15:
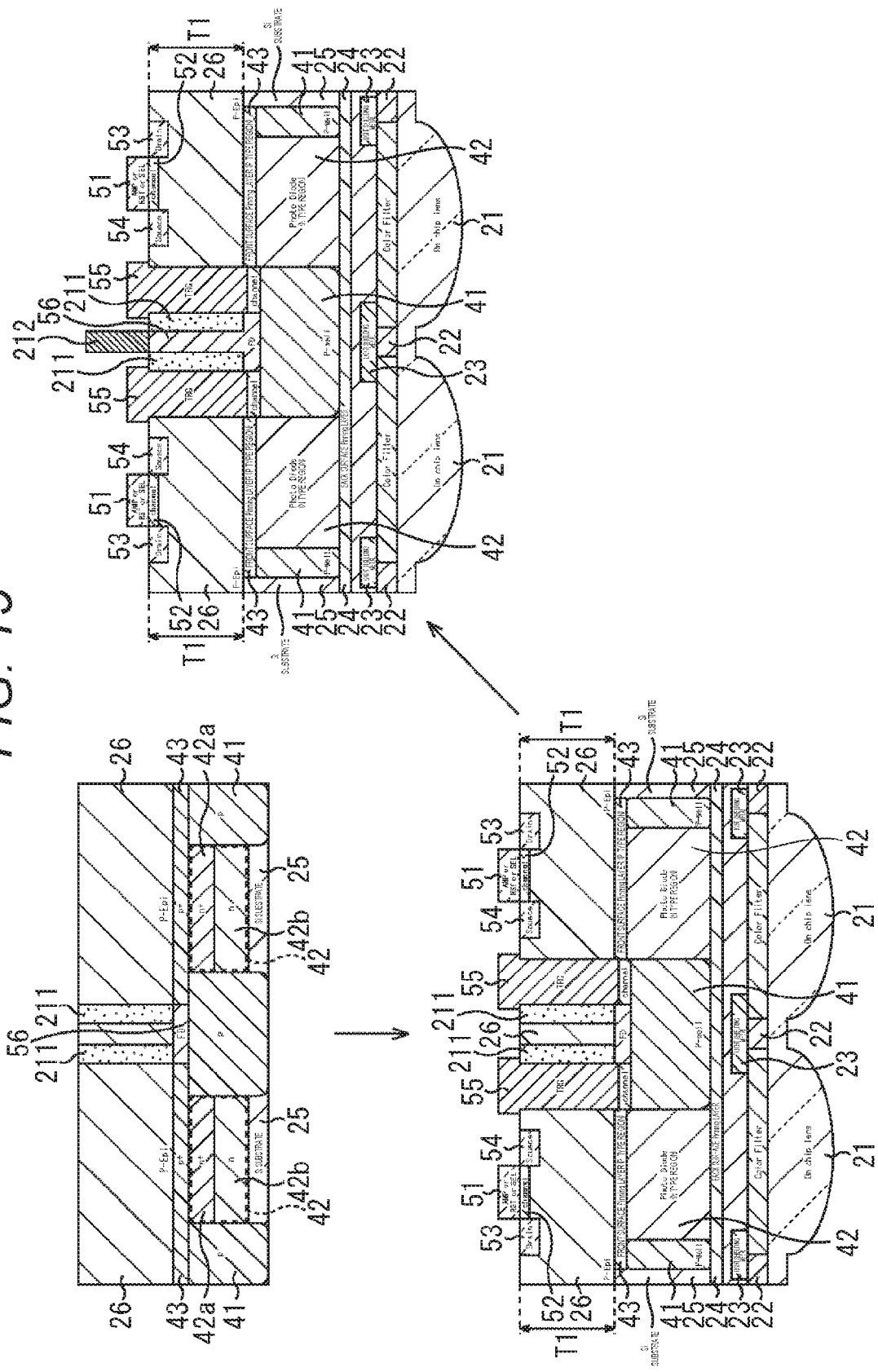
FIG. 15 is an explanatory diagram for a manufacturing method of the solid-state imaging device in FIG. 14.

In a second step, as illustrated in a lower left portion of FIG. 15, the transfer transistor gate 55 is formed in a manner extending across the photo diode 42 and the floating diffusion 56, and also other pixel transistor gates 51 are formed.

In a third step, as illustrated in an upper right portion of FIG. 15, impurities of the floating diffusion 56 are implanted and then an FD contact 212 is formed. Thus, the solid-state imaging device is completed. Meanwhile, in the above-described manufacturing method, an example in which manufacturing is started after finishing impurity implantation for the floating diffusion 56 at a bottom portion of the epitaxial layer 26 has been described. However, in the third step, impurity implantation may also be performed in processing immediately before forming the FD contact 212.

The solid-state imaging device having the configuration in which the oxide film (SiO2) having the thickness of the gate oxide film or larger is arranged between the gate 55 and the floating diffusion 56 can be manufactured by the above-described manufacturing method.

As a result, degradation of the conversion efficiency caused by capacity increase of the floating diffusion 56 can be suppressed. Additionally, since the electrical field between the gate 55 and the floating diffusion 56 can be relaxed, reliability of the transfer transistor gate can be improved.

8. Eighth Embodiment

A description has been provided above for a solid-state imaging device in which an oxide film (SiO2) having a thickness of a gate oxide film or larger is arranged between a gate 55 and a floating diffusion 56, but additionally, an embedded floating diffusion may also be implemented by forming connection to the floating diffusion with metal wiring.

Figure 16:
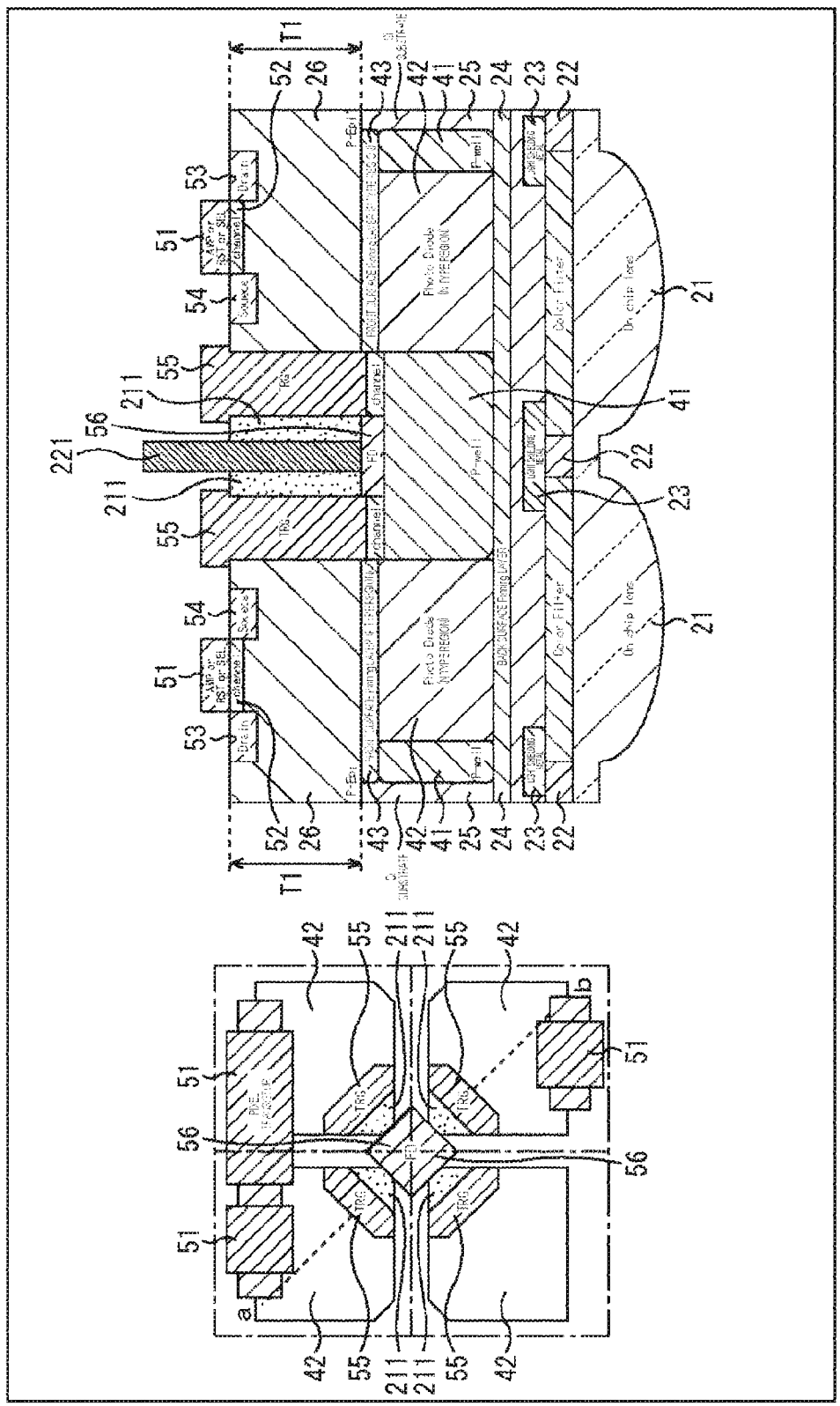
FIG. 16 is an explanatory diagram for an exemplary configuration of a solid-state imaging device according to an eighth embodiment of the present technology.

FIG. 16 illustrates an exemplary configuration of the solid-state imaging device in which SiO2 is arranged between the gate 55 and the floating diffusion 56 as an oxide film, and furthermore, the embedded the floating diffusion 56 is implemented by forming connection to the floating diffusion 56 with metal wiring. A left portion of FIG. 16 is similar to a case in FIG. 14. Additionally, a right portion of FIG. 16 is a cross-sectional view taken along a line a-b indicated by a dot line in the 2×2 pixels in the left portion of FIG. 16.

As illustrated in the right portion of FIG. 16, an oxide film 211 formed of SiO2 or the like is provided between the floating diffusion 56 and the gate 55. Furthermore, the floating diffusion 56 is connected to a bottom portion of an epitaxial layer 26 with metal wiring 221, thereby implementing the embedded floating diffusion 56.

With the configuration illustrated in FIG. 16, degradation of conversion efficiency caused by capacity increase of the floating diffusion 56 can be suppressed. Additionally, since an electrical field between the gate 55 and the floating diffusion 56 can be relaxed, reliability of a transfer transistor gate can be improved. Moreover, further miniaturization of a pixel can be achieved by the metal wiring 221.

<Manufacturing Method of Solid-State Imaging Device in FIG. 16>

Next, a manufacturing method of the solid-state imaging device in FIG. 16 will be described with reference to FIG. 17. In a first step, as illustrated in an upper left portion of FIG. 17, a trench is formed in a region to be formed with the oxide film 211 of the epitaxial layer 26 and a region to be formed with the metal wiring 221, and subsequently SiO2 to form the oxide film 211 is filled into the trench. A second step is similar processing to the one described above, and therefore, a description therefor will be omitted.

Figure 17:
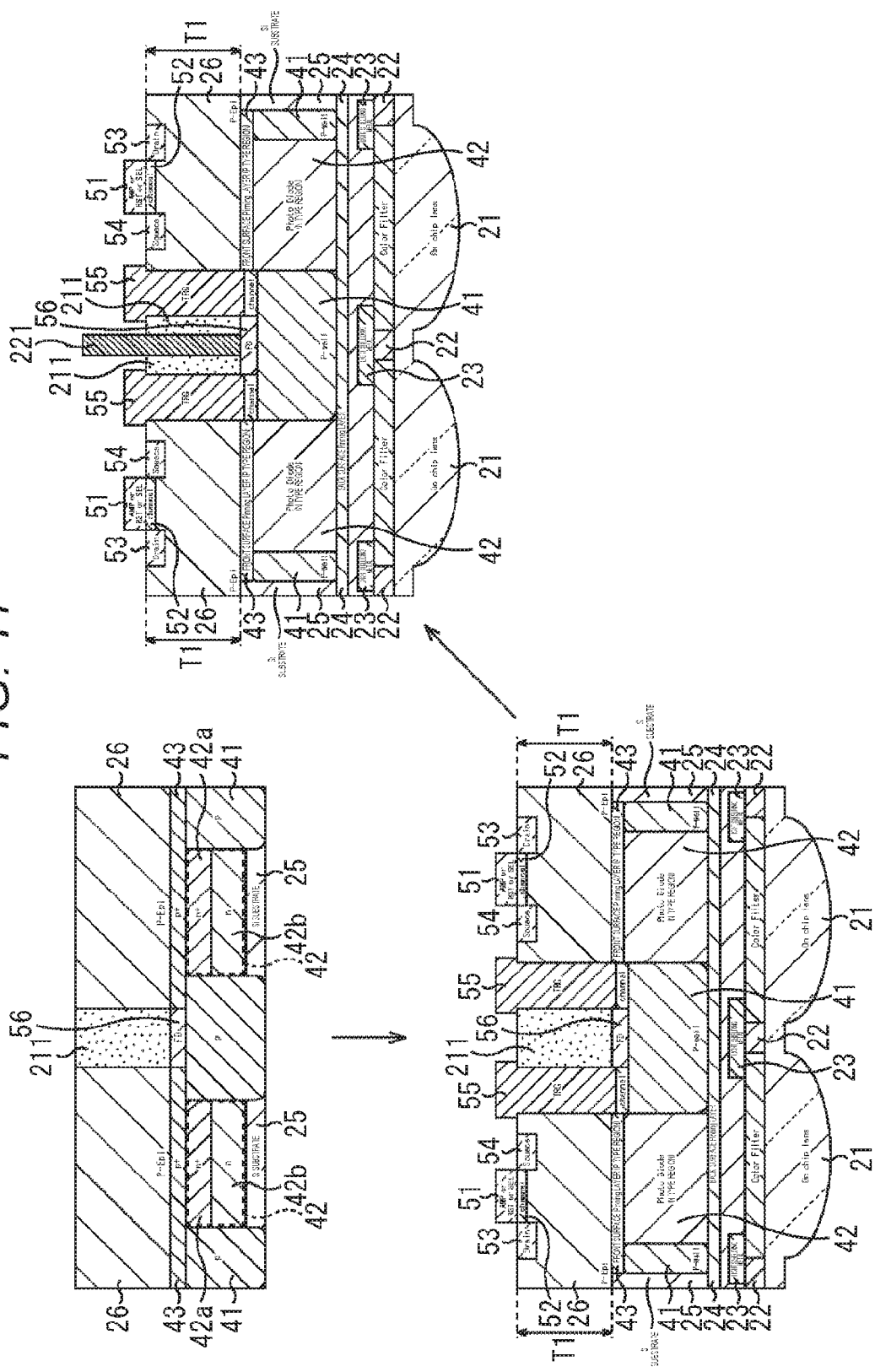
FIG. 17 is an explanatory diagram for a manufacturing method of the solid-state imaging device in FIG. 16.

In a third step, as illustrated in an upper right portion of FIG. 17, the trench is formed in a manner electrically connected the floating diffusion 56 provided at a bottom portion of the epitaxial layer 26, and the metal wiring 221 is formed in a manner connected to the floating diffusion 56. Thus, the solid-state imaging device is completed. Meanwhile, a contact between the floating diffusion 56 and the metal wiring 221 may also be formed by interposing a thin insulation film.

The solid-state imaging device in which the oxide film (SiO2) having the thickness of the gate oxide film or larger is arranged between the gate 55 and the floating diffusion 56 and furthermore the metal wiring 221 connected to the floating diffusion 56 is provided can be manufactured by the above-described manufacturing method.

As a result, degradation of the conversion efficiency caused by capacity increase of the floating diffusion 56 can be suppressed. Additionally, since the electrical field between the gate 55 and the floating diffusion 56 can be relaxed, reliability of the transfer transistor gate can be improved. Moreover, pixel miniaturization can be achieved by enlarging a width of the trench to form the oxide film 211 and using the metal wiring 221.

9. Ninth Embodiment

A description has been provided above for an example in which an oxide film SiO2 having a thickness of a gate oxide film or larger is arranged between a floating diffusion 56 and a gate 55, but additionally, the oxide film SiO2 having the thickness of the gate oxide film or larger may also be filled in a manner surrounding the gate 55.

Figure 18:
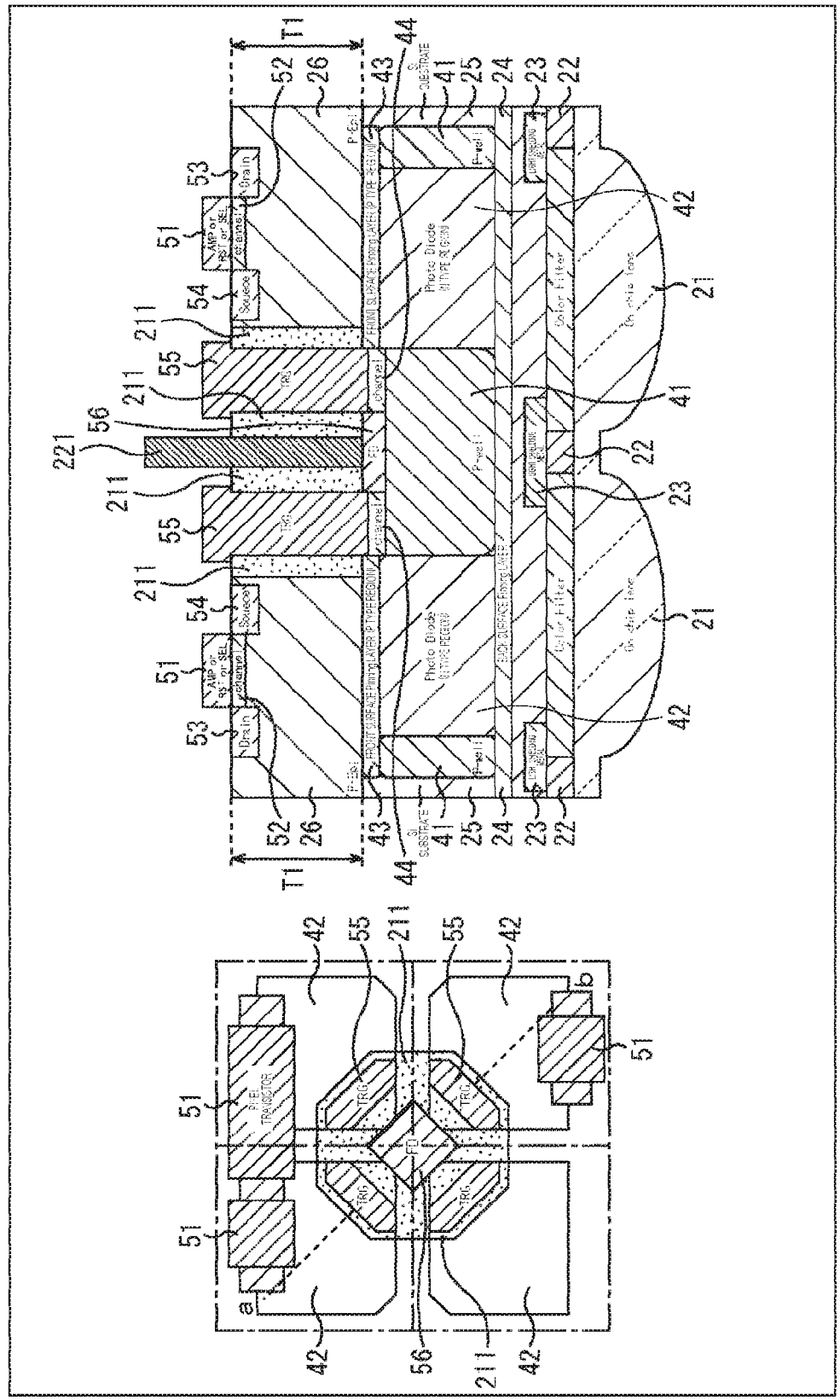
FIG. 18 is an explanatory diagram for an exemplary configuration of a solid-state imaging device according to a ninth embodiment of the present technology.

FIG. 18 illustrates an exemplary configuration of a solid-state imaging device in which the oxide film SiO2 having a thickness of a gate oxide film or larger is arranged between the floating diffusion 56 and the gate 55, and additionally the oxide film SiO2 having the thickness of the gate oxide film or larger is filled in a manner surrounding the gate 55.

As illustrated in a left portion of FIG. 18, the transfer transistor gate 55 contacting the floating diffusion 56 provided at a center of 2×2 pixels and shared by four pixels is provided at a corner portion of each of the pixels (photo diodes 42). Then, the oxide film formed of SiO2 is provided in a manner surrounding the gate 55. Additionally, pixel transistor gates 51 are provided at an upper side and a lower side of the 2×2 pixels in the drawing.

As illustrated in a right portion of FIG. 18, an oxide film 211 formed of SiO2 or the like is provided between the floating diffusion 56 and the gate 55, and additionally provided in a manner surrounding the gate 55.

By forming a configuration in which the oxide film (SiO2) having the thickness of the gate oxide film or larger is provided not only between the gate 55 and the floating diffusion 56 but also around the gate 55, only a bottom portion of the transfer transistor gate 55 contributes to charge transfer. As a result, degradation of conversion efficiency can be suppressed because capacity increase of the floating diffusion 56 can be reduced. Additionally, since an electrical field between the gate 55 and the floating diffusion 56 can be relaxed, reliability of the transfer transistor gate can be improved.

<Manufacturing Method of Solid-State Imaging Device in FIG. 18>

Next, a manufacturing method of the solid-state imaging device in FIG. 18 will be described with reference to FIG. 19.

Figure 19:
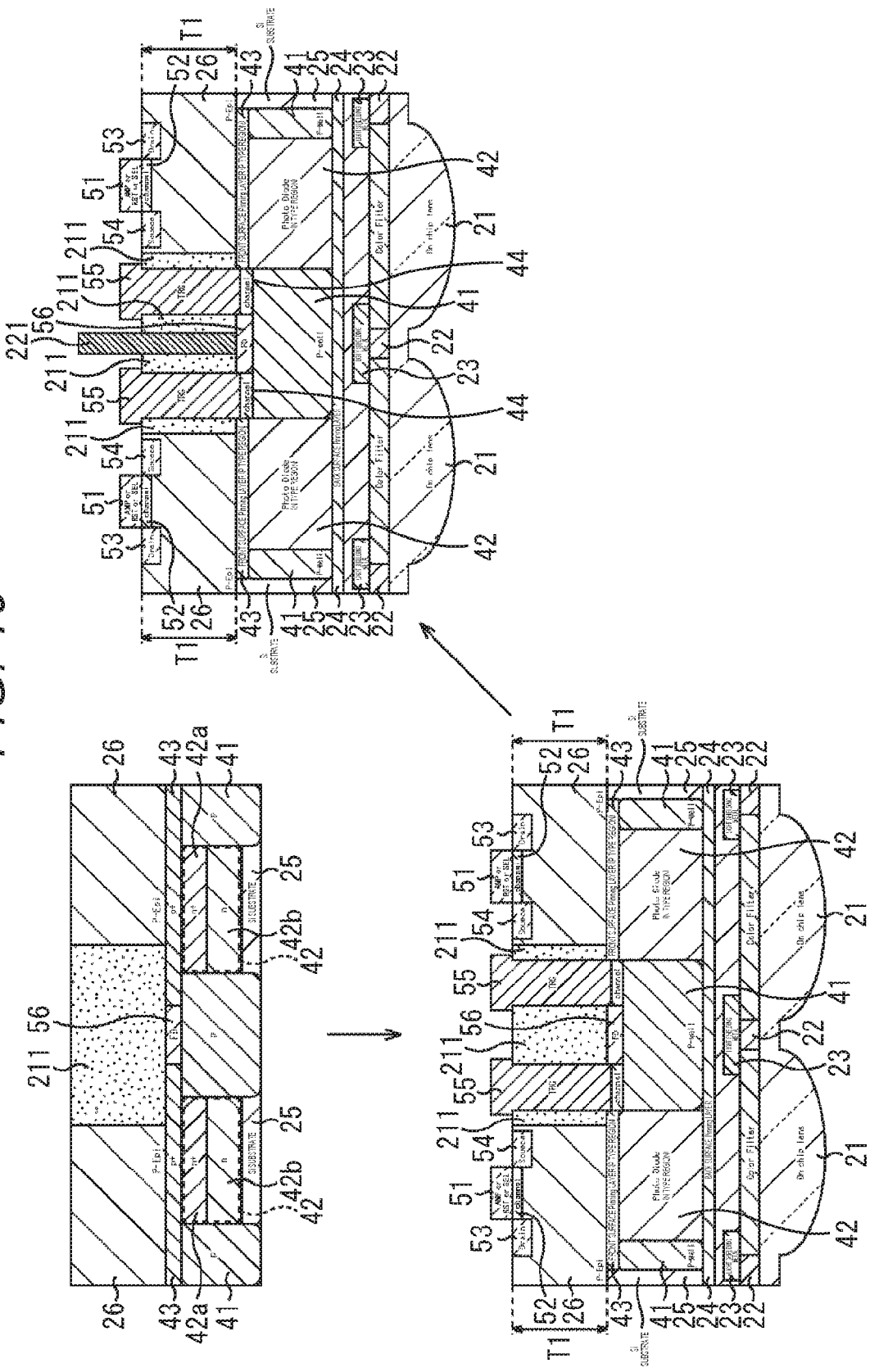
FIG. 19 is an explanatory diagram for a manufacturing method of the solid-state imaging device in FIG. 18.

In a first step, as illustrated in an upper left portion of FIG. 19, a trench is formed at an epitaxial layer 26, and the floating diffusion 56 is formed by implanting impurities, and then SiO2 to form the oxide film 211 is filled into trench.

In a second step, as illustrated in a lower left portion of FIG. 19, the transfer transistor gate 55 is formed in a manner extending across the photo diode 42 and the floating diffusion 56 at a bottom portion of the oxide film 211, and also other pixel transistor gates 51 are formed.

In a third step, as illustrated in an upper right portion of FIG. 19, metal wiring 221 is connected such that the floating diffusion 56 is embedded. Thus, the solid-state imaging device is completed.

The solid-state imaging device having the configuration in which the oxide film (SiO2) having the thickness of the gate oxide film or larger is arranged not only between the gate 55 and the floating diffusion 56 but also in a manner surrounding the gate 55 can be manufactured by the above-described manufacturing method.

As a result, degradation of conversion efficiency caused by capacity increase of the floating diffusion 56 can be suppressed with higher accuracy. Additionally, since the electrical field between the gate 55 and the floating diffusion 56 can be relaxed with higher accuracy, reliability of the transfer transistor gate can be further improved. Moreover, miniaturization of a pixel size can be achieved.

10. Tenth Embodiment

A description has been provided above for an example in which an oxide film SiO2 having a thickness of a gate oxide film or larger is arranged not only between a floating diffusion 56 and a gate 55 but also in a manner surrounding a gate 55. However, additionally, more pixel militarization may be achieved by thinning a portion of the transfer transistor gate 55 except for other portions thereof needed to have an execution width that extends across a photo diode 42 and a floating diffusion 56.

Figure 20:
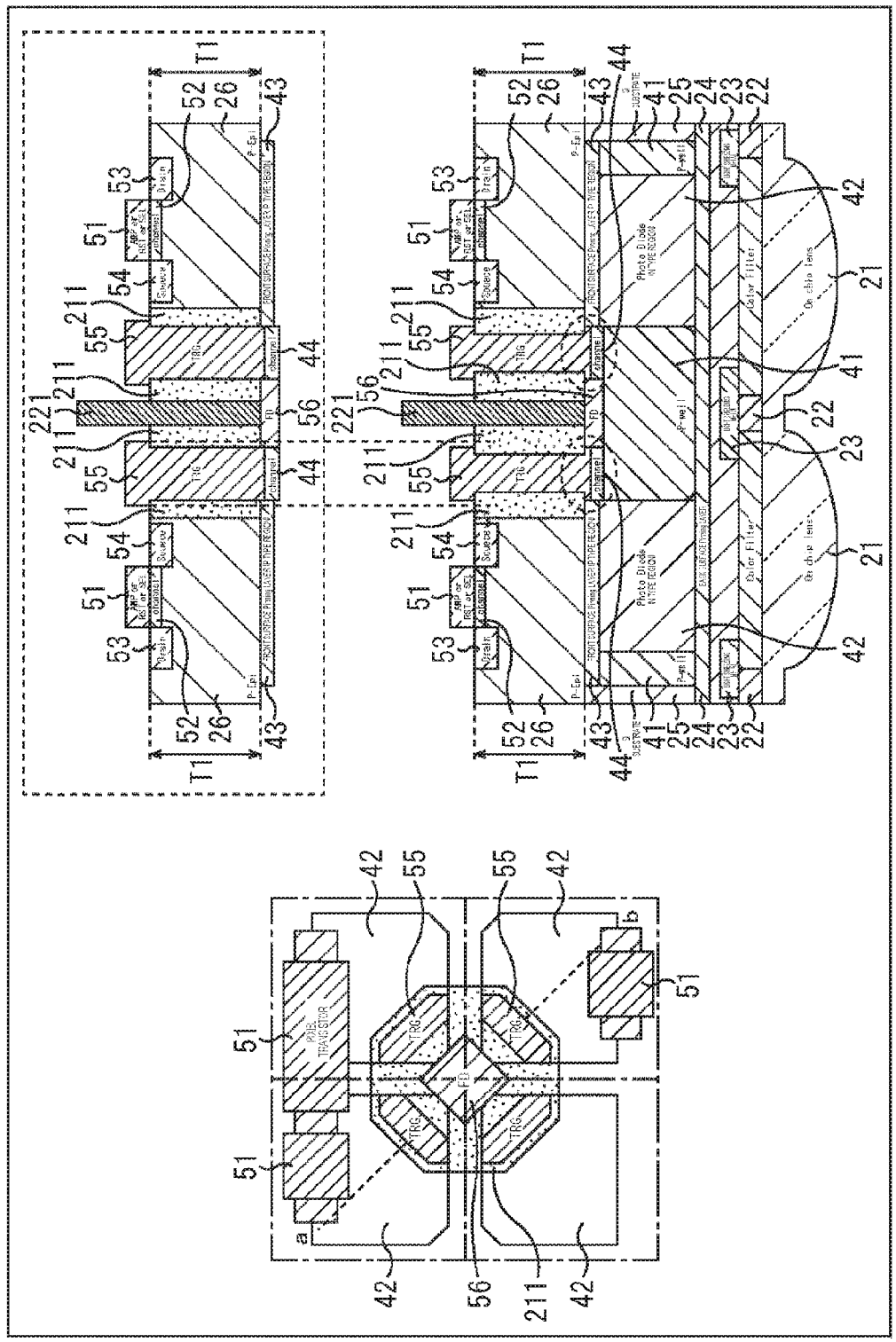
FIG. 20 is an explanatory diagram for an exemplary configuration of a solid-state imaging device according to a tenth embodiment of the present technology.

FIG. 20 illustrates an exemplary configuration of a solid-state imaging device in which the portion of the transfer transistor gate 55 except for other portions thereof needed to have the execution width that extends across the photo diode 42 and the floating diffusion 56 is formed thin.

A configuration in a top surface view in a left portion of FIG. 20 is similar to a case in FIG. 18. Further, as illustrated in a lower right portion of FIG. 20, an oxide film 211 formed of SiO2 or the like is provided between the floating diffusion 56 and the gate 55 and additionally provided in a manner surrounding the gate 55. Note that an upper right portion of FIG. 20 is similar to a configuration in a right portion of FIG. 18.

Furthermore, as illustrated in a lower right portion of FIG. 20, a top portion of the gate 55 has a configuration smaller than the gate 55 illustrated in the right portion of FIG. 18. Additionally, an execution width (diameter) of a bottom portion of the gate 55 surrounded by a dotted line in the lower right portion of FIG. 20 is a minimum width (diameter) that can extend across the floating diffusion 56 and the photo diode 42. By having the configuration indicated by the gate 55 in FIG. 20, the gate 55 can be formed thin and small except for the top portion and the bottom portion.

With this configuration, degradation of conversion efficiency caused by capacity increase of the floating diffusion 56 can be suppressed. Additionally, since the electrical field between the gate 55 and the floating diffusion 56 can be relaxed, reliability of the transfer transistor gate can be improved. Moreover, pixel miniaturization can be achieved with higher accuracy.

<Manufacturing Method of Solid-State Imaging Device in FIG. 20>

Next, a manufacturing method of the solid-state imaging device in FIG. 20 will be described with reference to FIG. 21.

Figure 21:
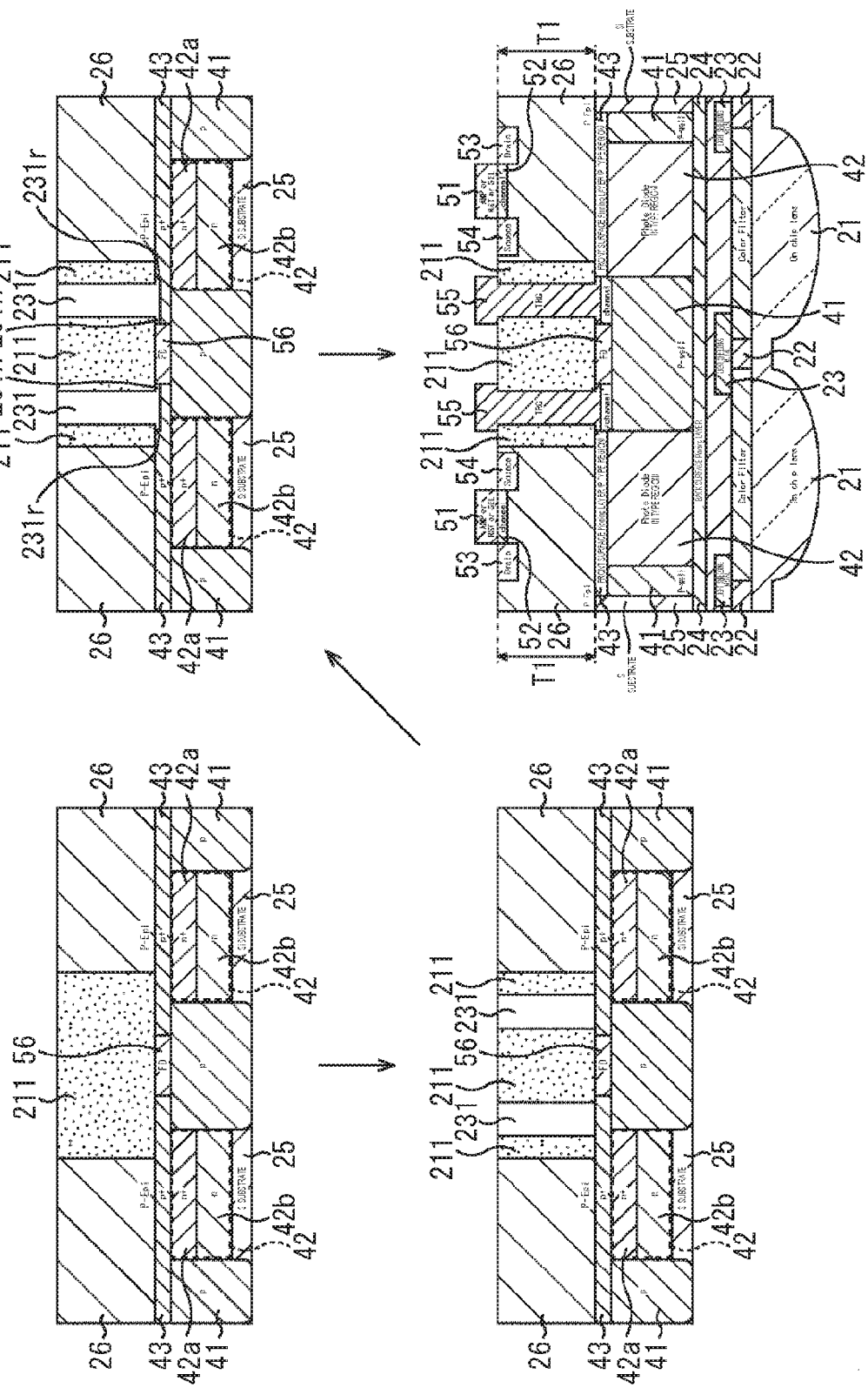
FIG. 21 is an explanatory diagram for a manufacturing method of the solid-state imaging device in FIG. 20.

In a first step, as illustrated in an upper left portion of FIG. 21, a trench is formed in a region to be formed with the oxide film 211 of the epitaxial layer 26, and SiO2 to form the oxide film 211 is filled into the trench.

In a second step, as illustrated in a lower left portion of FIG. 21, a trench 231 having a width that can extend over the photo diode 42 and the floating diffusion 56 at a bottom portion of the oxide film 211 in subsequent processing is formed.

In a third step, as illustrated in an upper right portion of FIG. 21, bottom portions 231r and 231n are formed on the bottom portion of trench 231 by isotropic etching. The bottom portions 231r, 231n each have a diameter that is larger than the diameter of the trench 231 and corresponds to a minimum width to extend across the photo diode 42 and the floating diffusion 56. By forming these bottom portions 231r and 231n, it is possible to obtain a configuration in which the execution width formed of the minimum width can extend over the photo diode 42 and the floating diffusion 56.

In a fourth step, as illustrated in a lower right portion of FIG. 21, the gate 55 is formed in the trench 231 and extends across the photo diode 42 and the floating diffusion 56 in a state that only the bottom portions 231r and 231n contribute to charge transfer.

In a fifth step, as illustrated in the lower right portion of FIG. 20, metal wiring 221 is electrically connected so as to form an embedded floating diffusion. Thus, the solid-state imaging device is completed.

By the above-described manufacturing method, the diameter of the gate 55 is formed in a manner extending across the photo diode 42 and the floating diffusion 56 at the bottom portions 231r, 231n as illustrated in the lower right portion of FIG. 20. As a result, in the solid-state imaging device in the lower right portion of FIG. 20, a top portion of the gate 55 can be formed smaller, compared to the configuration in the upper right portion of FIG. 20 (similar to the right portion of FIG. 18). Therefore, the pixel can be more miniaturized.

11. Eleventh Embodiment

Solid-state imaging devices described in first to tenth embodiments may be applied to an imaging device mounted on an electronic device such as a smartphone and a portable phone.

Figure 22:
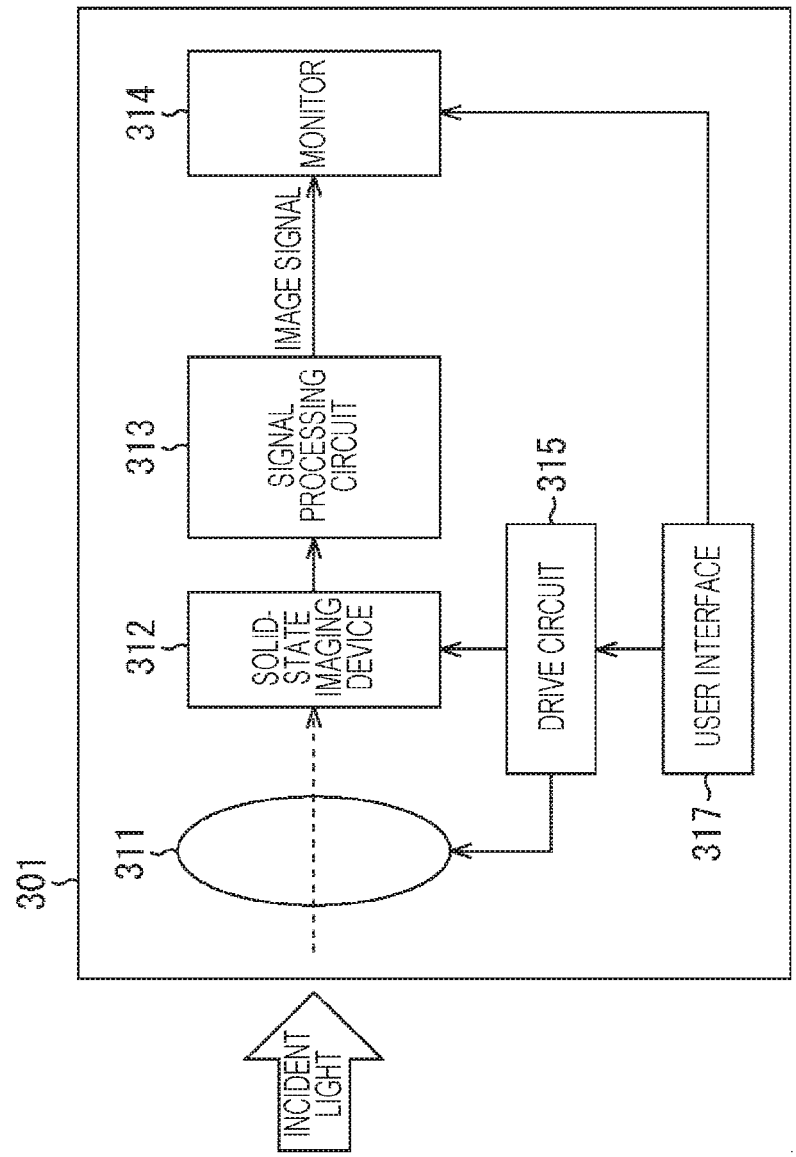
FIG. 22 is an explanatory diagram for an exemplary configuration of an electronic device including an imaging device provided with a solid-state imaging device according to an eleventh embodiment of the present technology.

FIG. 22 is a block diagram illustrating an exemplary configuration of an imaging device including a solid-state imaging device according to the first to tenth embodiments mounted on the electronic device.

As illustrated in FIG. 22, an imaging device 301 includes an optical system 311, a solid-state imaging device 312, a signal processing circuit 313, a monitor 314, a drive circuit 315, and a user interface 316, and can pick up a still image and a moving image.

The optical system 311 is formed of one or a plurality of lenses, guides image light (incident light) from an object to the solid-state imaging device 312, and forms an image on an imaging surface of the solid-state imaging device 312.

The solid-state imaging device 312 is any one of the above-described embodiments. In the solid-state imaging device 312, electrons are accumulated for a predetermined period in accordance with an image formed on a light receiving surface via the optical system 311. Then, a signal corresponding to the electrons accumulated in the solid-state imaging device 312 is supplied to the signal processing circuit 313. Also, the solid-state imaging device 312 transfer the signal in accordance with a drive signal (timing signal) supplied from the drive circuit 315.

The signal processing circuit 313 applies various kinds of signal processing to a pixel signal output from the solid-state imaging device 312. An image signal obtained by the signal processing circuit 313 applying the signal processing is supplied and stored in a memory not illustrated.

The monitor 314 is formed of a liquid crystal display (LCD) and displays the image signal output from the signal processing circuit 313.

The drive circuit 315 drives the optical system 311 and the solid-state imaging device 312.

The user interface 316 is formed of a button or a touch panel, receives user's operation, and supplies the monitor 314 or the drive circuit 315 with a signal corresponding to the user's operation.

The imaging device in which transfer characteristics of charge accumulated by a photo diode 42 are improved can be implemented by the solid-state imaging device mounted on the electronic device as the imaging device illustrated in FIG. 22.

Further, the present technology may adopt the following configurations.

(1) A back-illuminated type solid-state imaging device including:

a pixel transistor formed on a first layer;

a photo diode formed on a second layer separated from the first layer in a depth direction; and a transfer transistor adapted to control charge transfer of the photo diode, wherein the transfer transistor is formed in a manner embedded in the first layer.

(2) The back-illuminated type solid-state imaging device recited in (1), wherein a gate of the transfer transistor is formed in the second layer.

(3) The back-illuminated type solid-state imaging device according to (1) or (2), further including a floating diffusion adapted to detect charge transferred from the photo diode, wherein the floating diffusion is formed at a position including the second layer.

(4) The back-illuminated type solid-state imaging device recited in (3), wherein a portion of the floating diffusion is formed to have a depth same as a portion of the photo diode relative to a light incident direction, and a channel that is opened/closed by control of the transfer transistor is formed between the portion of the floating diffusion and the portion of the photo diode having the same depth.

(5) The back-illuminated type solid-state imaging device recited in (3), wherein the floating diffusion has an entire configuration as one integrated body, penetrates the first layer, and is formed at a position including the second layer.

(6) The back-illuminated type solid-state imaging device recited in (3), wherein the floating diffusion is formed in a separate manner in each of the first layer and the second layer.

(7) The back-illuminated type solid-state imaging device recited in (3), wherein the floating diffusion is formed in the second layer, and a contact that electrically connects the floating diffusion is formed by excavation so as to penetrate the first layer.

(8) The back-illuminated type solid-state imaging device recited in (3), wherein an oxide film is formed in the first layer at a position adjacent to each of a drain and a source of the pixel transistor in a manner interposing the pixel transistor.

(9) The back-illuminated type solid-state imaging device recited in (8), wherein an embedded oxide film is formed in the second layer as a continuous configuration at a position corresponding to the oxide film of the first layer.

(10) The back-illuminated type solid-state imaging device recited in (1) to (9), wherein a front surface side pinning layer of the photo diode on the second layer, which is provided as a boundary surface between the first layer and the second layer, is formed by p type epitaxial growth.

(11) The back-illuminated type solid-state imaging device recited in (10), wherein the front surface pinning layer is formed by in-site doped Epi growth.

(12) The back-illuminated type solid-state imaging device recited in (3), wherein an oxide film having a thickness of a gate oxide film or larger is formed between the floating diffusion and the transfer transistor gate.

(13) The back-illuminated type solid-state imaging device recited in (12), wherein the floating diffusion is formed in the second layer, and metal wiring that electrically connects the floating diffusion is formed by excavation so as to penetrate the first layer.

(14) The back-illuminated type solid-state imaging device recited in (12), wherein an oxide film having a thickness of a gate oxide film or larger is formed in a manner surrounding the transfer transistor gate.

(15) The back-illuminated type solid-state imaging device recited in (12), wherein only a bottom portion of the transfer transistor gate is formed in a manner extending across the floating diffusion and the photo diode, and other portions are formed to have a diameter smaller than the bottom portion.

(16) A manufacturing method of a back-illuminated type solid-state imaging device, the back-illuminated type solid-state imaging device including:
a pixel transistor formed on a first layer;
a photo diode formed on a second layer separated from the first layer in a depth direction; and
a transfer transistor adapted to control charge transfer of the photo diode,
wherein the transfer transistor is formed in a manner embedded in the first layer,
the manufacturing method including:
forming a first layer, and then forming an excavated portion in the first layer such that a gate of the transfer transistor is formed in the second layer; and
forming the transfer transistor in the excavated portion such that the gate is formed in the second layer.

(17) An electronic device provided with a back-illuminated type solid-state imaging device, including:
a pixel transistor formed on a first layer;
a photo diode formed on a second layer separated from the first layer in a depth direction; and
a transfer transistor adapted to control charge transfer of the photo diode,
wherein the transfer transistor is formed in a manner embedded in the first layer.

REFERENCE SIGNS LIST

21 On chip lens
22 Color filter
23 Light shielding metal
24 Back surface pinning layer
25 Silicon substrate
26 Epitaxial layer
41 Separation layer
42 Photo diode
43 Front surface pinning layer
51 Gate
52 Channel
53 Drain
54 Source
55 Gate
56 Floating Diffusion
61 Excavated portion
71 Gate oxide film
91 Sub-floating diffusion
101 Channel
121 Contact
141 Oxide film
171 Oxide film
181 Embedded oxide film
191 p+-Epi layer
211 Oxide film
221 Metal wiring

What is claimed is:

1. A back-illuminated type solid-state imaging device comprising:
a pixel transistor formed on a first layer;
a photo diode formed on a second layer separated from the first layer in a depth direction;
a transfer transistor configured to control charge transfer of the photo diode, wherein the transfer transistor is embedded in the first layer; and
a floating diffusion configured to detect charge transferred from the photo diode, wherein the floating diffusion is formed at a position including the second layer, wherein the floating diffusion has an entire configuration as one integrated body, and wherein the floating diffusion penetrates the first layer.

2. The back-illuminated type solid-state imaging device according to claim 1, wherein a gate of the transfer transistor is at least partially formed in the second layer.

3. The back-illuminated type solid-state imaging device according to claim 1, wherein a portion of the floating diffusion is formed to have a depth same as a portion of the photo diode relative to a light incident direction, and a channel that is opened/closed by control of the transfer transistor is formed between the portion of the floating diffusion and the portion of the photo diode having the same depth.

4. The back-illuminated type solid-state imaging device according to claim 1, wherein an oxide film is formed in the first layer at a position adjacent to each of a drain and a source of the pixel transistor in a manner interposing the pixel transistor.

5. The back-illuminated type solid-state imaging device according to claim 4, wherein an embedded oxide film is formed in the second layer as a continuous configuration at a position corresponding to the oxide film of the first layer.

6. The back-illuminated type solid-state imaging device according to claim 1, wherein a front surface side pinning layer of the photo diode on the second layer, which is provided as a boundary surface between the first layer and the second layer, is formed by p type epitaxial growth.

7. The back-illuminated type solid-state imaging device according to claim 6, wherein the front surface pinning layer is formed by in-site doped Epi growth.

8. The back-illuminated type solid-state imaging device according to claim 1, wherein an oxide film having a thickness of a gate oxide film or larger is formed between the floating diffusion and the transfer transistor gate.

9. A manufacturing method of a back-illuminated type solid-state imaging device, the back-illuminated type solid-state imaging device including:
a pixel transistor formed on a first layer;
a photo diode formed on a second layer separated from the first layer in a depth direction;
a transfer transistor configured to control charge transfer of the photo diode,
wherein the transfer transistor is formed in a manner embedded in the first layer; and
a floating diffusion configured to detect charge transferred from the photo diode, wherein the floating diffusion is formed at a position including the second layer, wherein the floating diffusion has an entire configuration as one integrated body, and wherein the floating diffusion penetrates the first layer;
the manufacturing method comprising:
forming a first layer, and then forming an excavated portion in the first layer such that a gate of the transfer transistor is formed in the second layer; and
forming the transfer transistor in the excavated portion such that the gate is formed in the second layer.

10. An electronic device provided with a back-illuminated type solid-state imaging device, comprising:
a pixel transistor formed on a first layer;
a photo diode formed on a second layer separated from the first layer in a depth direction;
a transfer transistor configured to control charge transfer of the photo diode,
wherein the transfer transistor is embedded in the first layer; and
a floating diffusion configured to detect charge transferred from the photo diode, wherein the floating diffusion is formed at a position including the second layer, wherein the floating diffusion has an entire configuration as one integrated body, and wherein the floating diffusion penetrates the first layer.

11. The electronic device according to claim 10, wherein a gate of the transfer transistor is at least partially formed in the second layer.

12. The electronic device according to claim 10, wherein a portion of the floating diffusion is formed to have a depth same as a portion of the photo diode relative to a light incident direction, and a channel that is opened/closed by control of the transfer transistor is formed between the portion of the floating diffusion and the portion of the photo diode having the same depth.

13. The electronic device according to claim 10, wherein an oxide film is formed in the first layer at a position adjacent to each of a drain and a source of the pixel transistor in a manner interposing the pixel transistor.

14. The electronic device according to claim 13, wherein an embedded oxide film is formed in the second layer as a continuous configuration at a position corresponding to the oxide film of the first layer.

15. The electronic device according to claim 10, wherein a front surface side pinning layer of the photo diode on the second layer, which is provided as a boundary surface between the first layer and the second layer, is formed by p type epitaxial growth.

16. The electronic device according to claim 15, wherein the front surface pinning layer is formed by in-site doped Epi growth.

17. The electronic device according to claim 10, wherein an oxide film having a thickness of a gate oxide film or larger is formed between the floating diffusion and the transfer transistor gate.

* * * * *